(12) United States Patent
Sahin et al.

(10) Patent No.: US 11,716,687 B2
(45) Date of Patent: Aug. 1, 2023

(54) METHODS FOR FREQUENCY DIVISION MULTIPLEXED ON-OFF KEYING SIGNALS FOR WAKE-UP RADIOS

(71) Applicant: INTERDIGITAL PATENT HOLDINGS, INC., Wilmington, DE (US)

(72) Inventors: Alphan Sahin, Westbury, NY (US); Rui Yang, Greenlawn, NY (US); Frank La Sita, Setauket, NY (US); Hanqing Lou, Syosset, NY (US); Xiaofei Wang, Cedar Grove, NJ (US); Li Hsiang Sun, San Diego, CA (US)

(73) Assignee: INTERDIGITAL PATENT HOLDINGS, INC., Wilmington, DE (US)

(*) Notice: Subject to any disclaimer, the term of this patent is extended or adjusted under 35 U.S.C. 154(b) by 41 days.

(21) Appl. No.: 17/040,728

(22) PCT Filed: Mar. 22, 2019

(86) PCT No.: PCT/US2019/023546
§ 371 (c)(1),
(2) Date: Sep. 23, 2020

(87) PCT Pub. No.: WO2019/183457
PCT Pub. Date: Sep. 26, 2019

(65) Prior Publication Data
US 2021/0014788 A1 Jan. 14, 2021

Related U.S. Application Data

(60) Provisional application No. 62/687,947, filed on Jun. 21, 2018, provisional application No. 62/647,304, filed on Mar. 23, 2018.

(51) Int. Cl.
*H04W 52/02* (2009.01)
*H04L 27/04* (2006.01)
(Continued)

(52) U.S. Cl.
CPC ......... *H04W 52/0219* (2013.01); *H04L 27/04* (2013.01); *H04L 27/206* (2013.01); *H04W 84/12* (2013.01)

(58) Field of Classification Search
CPC ............. H04W 52/0219; H04W 48/10; H04W 52/0206; H04W 52/0216; H04W 52/0229;
(Continued)

(56) References Cited

U.S. PATENT DOCUMENTS 11,343,768 B2 5/2022 Son et al.
2014/0086362 A1* 3/2014 Dhayni ............... H04L 27/2647
375/329
(Continued)

OTHER PUBLICATIONS

Azizi et al., "A PAR Proposal for Wake-up Radio," IEEE 802.11-16/1045r09 (Jul. 2016).
(Continued)

*Primary Examiner* — Derrick V Rose
(74) *Attorney, Agent, or Firm* — Volpe Koenig

(57) ABSTRACT

An access point (AP) that supports the IEEE 802.11ba protocol may transmit a frame including a physical layer (PHY) preamble to one or more stations (STAs) over a channel. The PHY preamble may include a plurality of repeated modulated legacy signal (L-SIG) fields to spoof a recipient of the frame and protect a wake up signal (WUS) to be subsequently transmitted by the AP. The AP may transmit the WUS to at least a first STA of the one or more STAs, wherein the at least the first STA is a IEEE 802.11ba compliant STA.

18 Claims, 22 Drawing Sheets

(51) Int. Cl.
*H04L 27/20* (2006.01)
*H04W 84/12* (2009.01)

(58) Field of Classification Search
CPC ....... H04W 84/12; H04W 88/08; H03M 5/12; H04J 13/0014; H04L 27/04; H04L 27/206; Y02D 30/70
See application file for complete search history.

(56) References Cited

U.S. PATENT DOCUMENTS

| | | | | |
|---|---|---|---|---|
| 2016/0119453 | A1* | 4/2016 | Tian | H04L 5/04 370/338 |
| 2016/0337973 | A1 | 11/2016 | Park et al. | |
| 2017/0034838 | A1* | 2/2017 | Trainin | H04W 74/0808 |
| 2017/0111196 | A1* | 4/2017 | Su | H04W 84/12 |
| 2018/0184379 | A1* | 6/2018 | Liu | H04W 52/0219 |
| 2018/0206192 | A1* | 7/2018 | Vermani | H04L 27/2602 |
| 2018/0295578 | A1* | 10/2018 | Liu | H04L 27/04 |
| 2019/0036754 | A1* | 1/2019 | Lee | H04L 27/2627 |

OTHER PUBLICATIONS

Budisin, "Efficient pulse compressor for Golay complentary sequences", Electronics Letters, vol. 27, No. 3, pp. 219-220 (Jan. 1991).
Chen et al., "MAC and PHY Proposal for 802.11af," IEEE 802.11-10/0258r0 (Mar. 2010).
Chen, "Proposed Changes to D2.0 Clause 28.3.6," IEEE 802.11-18/0025r1 (Jan. 11, 2018).
Chen, "Proposed Changes to D2.2 Clause 28.3.20, 28.3.21," IEEE 802.11-18/0463r1 (Mar. 1, 2018).
Deng et al., "IEEE 802.11ax: Highly Efficient WLANs for Intelligent Information Infrastructure," IEEE Communications Magazine (Dec. 2017).
Draft IEEE Standard for Information technology—Telecommunications and information exchange between systems Local and metropolitan area networks—Specific requirements; Part 11: Wireless LAN Medium Access Control (MAC) and Physical Layer (PHY) Specifications; Amendment 4: Wake Up Radio Operation, IEEE P802.11ba/D2.0 (Jan. 2019).
Draft Standard for Information Technology—Telecommunications and information exchange between systems—Local and metropolitan area networks—Specific requirements; Part 11: Wireless LAN Medium Access Control (MAC) and Physical Layer (PHY) specifications; Amendment 5: Enhancements for Very High Throughput for Operation in Bands below 6GHz, IEEE P802.11ac/D1.0 (May 2011).
Draft Standard for Information technology—Telecommunications and information exchange between systems Local and metropolitan area networks—Specific requirements; Part 11: Wireless LAN Medium Access Control (MAC) and Physical Layer (PHY) Specifications; Amendment 6: Enhancements for High Efficiency WLAN, IEEE P802.11ax/D3.0 (Jun. 2018).
Draft Standard for Information technology—Telecommunications and information exchange between systems Local and metropolitan area networks—Specific requirements Part 11: Wireless LAN Medium Access Control (MAC) and Physical Layer (PHY) Specifications, IEEE P802.11-REVmd/D1.0 (Feb. 2018).
Halasz, "Sub 1 GHz license-exempt PAR and 5C," IEEE P802.11 Wireless LANs, IEEE 802.11-10/0001r13 (Jul. 2010).
Holzmann et al., "A Computer Search for Complex Golay Sequences," Australasian Journal of Combinatorics, pp. 251-258 (1994).
Hong et al., "A Low-Power WLAN Communication Scheme for IoT WLAN Devices Using Wake-Up Receivers," Applied Sciences, pp. 1-16 (2018).
IEEE P802.11ad-2012, IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications—Amendment 3: Enhancements for Very High Throughput in the 60 GHz Band, IEEE P802.11ad-2012 (Dec. 2012).
IEEE Standard for Information technology—Telecommunications and information exchange between systems—Local and metropolitan area networks—Specific requirements; Part 11: Wireless LAN Medium Access Control (MAC) and Physical Layer (PHY) Specifications, IEEE Std. 802.11-2012 (Mar. 29, 2012).
IEEE Standard for Information technology—Telecommunications and information exchange between systems—Local and metropolitan area networks—Specific requirements; Part 11: Wireless LAN Medium Access Control (MAC) and Physical Layer (PHY) Specifications, IEEE Std. 802.11-2016 (Dec. 7, 2016).
IEEE Standard for Information technology—Telecommunications and information exchange between systems—Local and metropolitan area networks—Specific requirements; Part 11: Wireless LAN Medium Access Control (MAC) and Physical Layer (PHY) Specifications; Amendment 4: Enhancements for Very High Throughput for Operation in Bands below 6GHz, IEEE Std 802.11ac-2013 (Dec. 11, 2013).
IEEE Standard for Information technology—Telecommunications and information exchange between systems—Local and metropolitan area networks—Specific requirements; Part 11: Wireless LAN Medium Access Control (MAC) and Physical Layer (PHY) specifications; Amendment 5: Television White Spaces (TVWS) Operation, IEEE 802.11af-2013 (Dec. 11, 2013).
IEEE Standard for Information technology—Telecommunications and information exchange between systems—Local and metropolitan area networks—Specific requirements; Part 11: Wireless LAN Medium Access Control (MAC) and Physical Layer (PHY) Specifications; Amendment 5: Enhancements for Higher Throughput, IEEE Std 802.11n-2009 (Sep. 2009).
IEEE Standard for Information technology—Telecommunications and information exchange between systems Local and metropolitan area networks—Specific requirements; Part 11: Wireless LAN Medium Access Control (MAC) and Physical Layer (PHY) Specifications; Amendment 2: Sub 1 GHz License Exempt Operation, IEEE 802.11ah-2016 (Dec. 7, 2016).
Jia Jia et al., "Performance Investigations on Single-carrier and Multiple-carrier-based WUR," IEEE 802.11-17/0373r1 (Mar. 16, 2017).
Kristem et al., "2 us OOK pulse for high rate," IEEE 802.11-18/0097r0 (Jan. 12, 2018).
Lopez et al., "MC-OOK Symbol Design," IEEE 802.11-18/0479r2 (Mar. 2018).
Park et al., "Various Symbol Types for WUR," IEEE 802.11-17/0350r0 (Mar. 13, 2017).
Parker et al., "Golay Complementary Sequences," (Jan. 19, 2004).
Sahin et al., "A comparison of BPSK-Mark Options," IEEE 802.11-18/1156r1 (Jul. 9, 2018).
Sahin et al., "A comparison of BPSK-Mark Options," IEEE 802.11-18/1156r0 (Jul. 9, 2018).
Sahin et al., "On OOK Waveform Specification," IEEE 802.11-18/460r1 (Mar. 5, 2018).
Sahin et al., "Proposed Spec Text on the construction of the BPSK Mark," IEEE 802.11-18/1068r8 (Jun. 11, 2018).
Shellhammer, "Comment Resolutions on BPSK-Mark Comments," IEEE P802.11-19/0424r0 (Mar. 12, 2019).
Stephens et al., "Current topics in 802.11: overview, high efficiency and reduced power consumption," IEEE 802.11-17/0355r0 (Mar. 13, 2017).
Suh et al., "Waveform Generation for Waveform Coding," IEEE 802.11-17/0376r0 (Mar. 13, 2017).
Supplement to IEEE Standard for Information technology—Telecommunications and information exchange between systems—Local and metropolitan area networks—Specific requirements; Part 11: Wireless LAN Medium Access Control (MAC) and Physical Layer (PHY) Specifications; High-speed Physical Layer in the 5 GHz Band, IEEE Std 802.11a-1999 (R2003) (Jun. 12, 2003).
Supplement to IEEE Standard for Information technology—Telecommunications and information exchange between systems—Local and metropolitan area networks—Specific requirements; Part 11: Wireless LAN Medium Access Control (MAC) and Physical

(56) References Cited

OTHER PUBLICATIONS

Layer (PHY) Specifications; Higher-speed Physical Layer Extension in the 2.4 GHz Band, IEEE Std 802.11b-1999 (R2003) (Jun. 12, 2003).

* cited by examiner

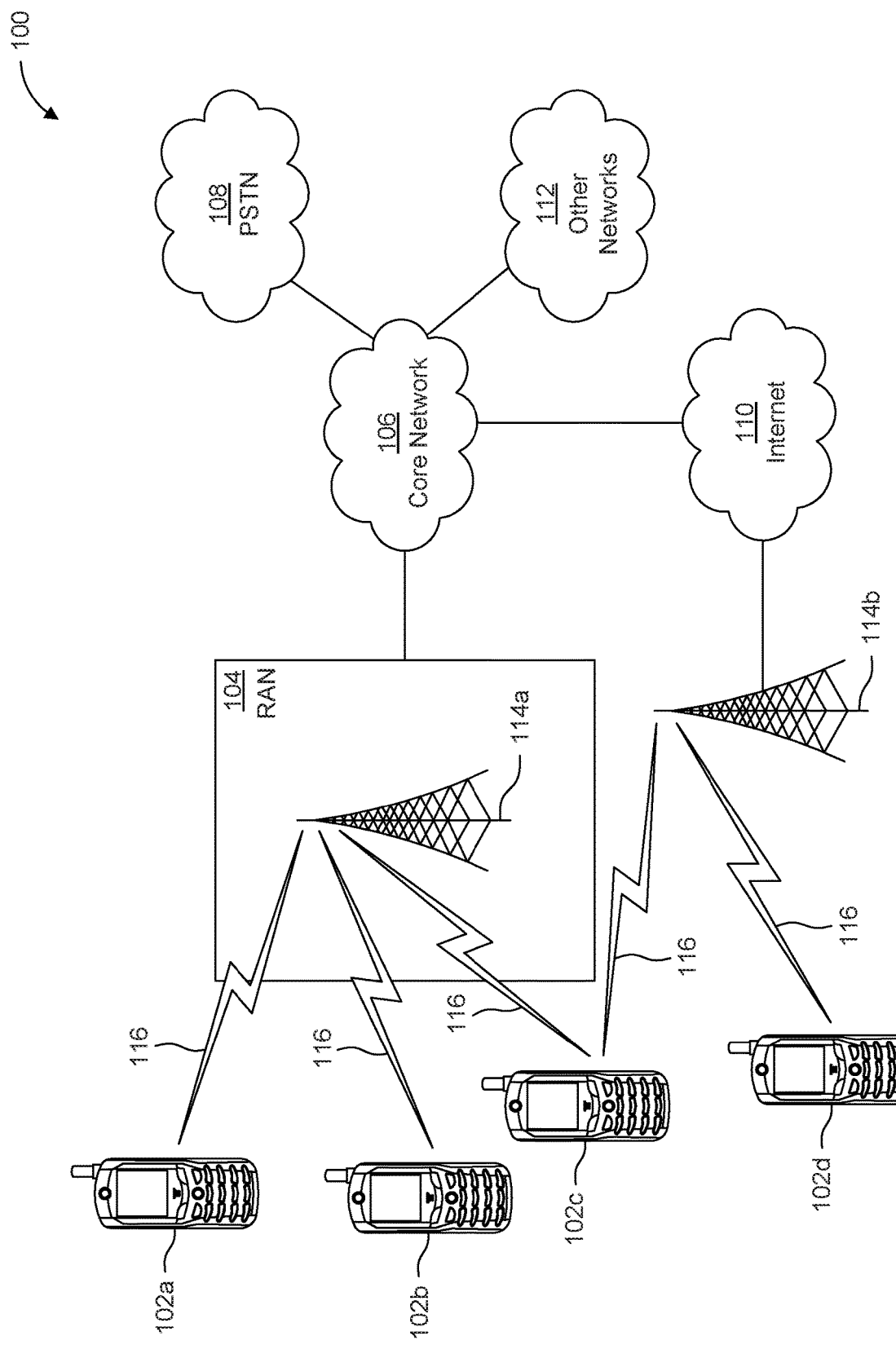

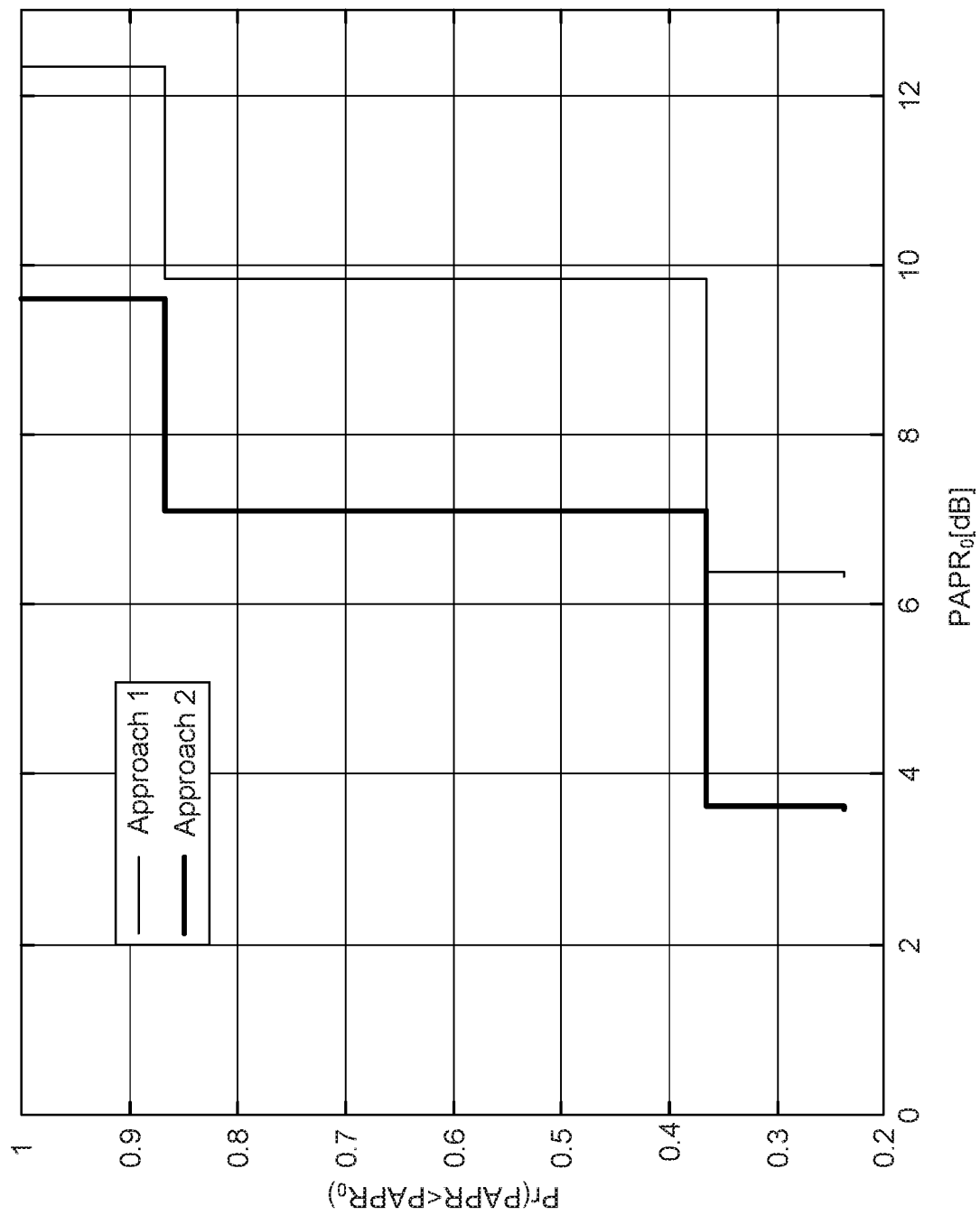

| Signature | CRC | Tail Bits |
| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
FIG. 13
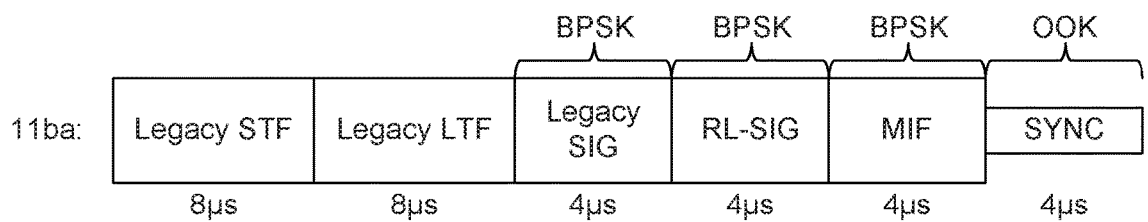
FIG. 14A
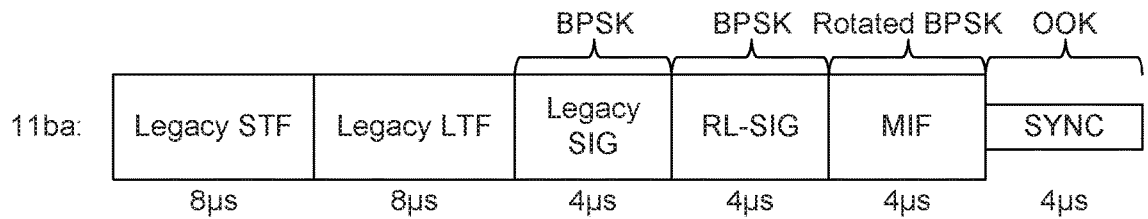
FIG. 14B

METHODS FOR FREQUENCY DIVISION MULTIPLEXED ON-OFF KEYING SIGNALS FOR WAKE-UP RADIOS

CROSS-REFERENCE TO RELATED APPLICATIONS

This application is the U.S. National Stage, under 35 U.S.C. § 371, of International Application No. PCT/US2019/023546 filed Mar. 22, 2019, which claims the benefit of U.S. Provisional Application No. 62/647,304 filed Mar. 23, 2018 and U.S. Provisional Application No. 62/687,947 filed Jun. 21, 2018, the contents of which are incorporated herein by reference.

BACKGROUND

A wireless local area network (WLAN) is a wireless distribution network that links two or more devices using wireless communication within a limited area, and may or may not include an access point (AP). Thus, a mobile user device (i.e., a station (STA)) can connect to a local area network (LAN) through a wireless (radio) connection.

SUMMARY

An access point (AP) that supports the IEEE 802.11ba protocol may transmit a frame including a physical layer (PHY) preamble to one or more stations (STAs) over a channel. The PHY preamble may include a plurality of repeated modulated legacy signal (L-SIG) fields to spoof a recipient of the frame and protect a wake up signal (WUS) to be subsequently transmitted by the AP. The AP may transmit the WUS to at least a first STA of the one or more STAs, wherein the at least the first STA is a IEEE 802.11ba compliant STA.

An AP may determine encoded bits for a given time for a plurality of wake up signals (WUSs) to be transmitted with different data rates on different channels. The AP may select a subset of sequences from a set of complementary sequences to apply across the channels based on the encoded bits. The AP may map the selected subset of sequences to corresponding channels in frequency. The AP may apply a single inverse discrete Fourier transform (IDFT) to the mapped sequences. The AP may append a cyclic prefix to the transformed sequences to generate the plurality of WUSs. The AP may transmit the plurality of WUSs on the different channels, such that symbol boundaries of the plurality of the plurality of WUSs are aligned in time.

BRIEF DESCRIPTION OF THE DRAWINGS

A more detailed understanding may be had from the following description, given by way of example in conjunction with the accompanying drawings, wherein like reference numerals in the figures indicate like elements, and wherein:

FIG. 1A is a system diagram illustrating an example communications system in which one or more disclosed embodiments may be implemented;

FIG. 6B shows a peak to average power ratio (PAPR) distribution when four channels, each with an HDR wake-up signal, are utilized;

FIG. 13 shows an example format of the mark-indication field (MIF) according to one or more embodiments;

FIG. 14A shows a preamble format with binary phase shift keying (BPSK) repeated legacy signal field;

FIG. 14B shows a preamble format with BPSK repeated legacy signal field and rotated BPSK MIF;

DETAILED DESCRIPTION

Figure 1B:
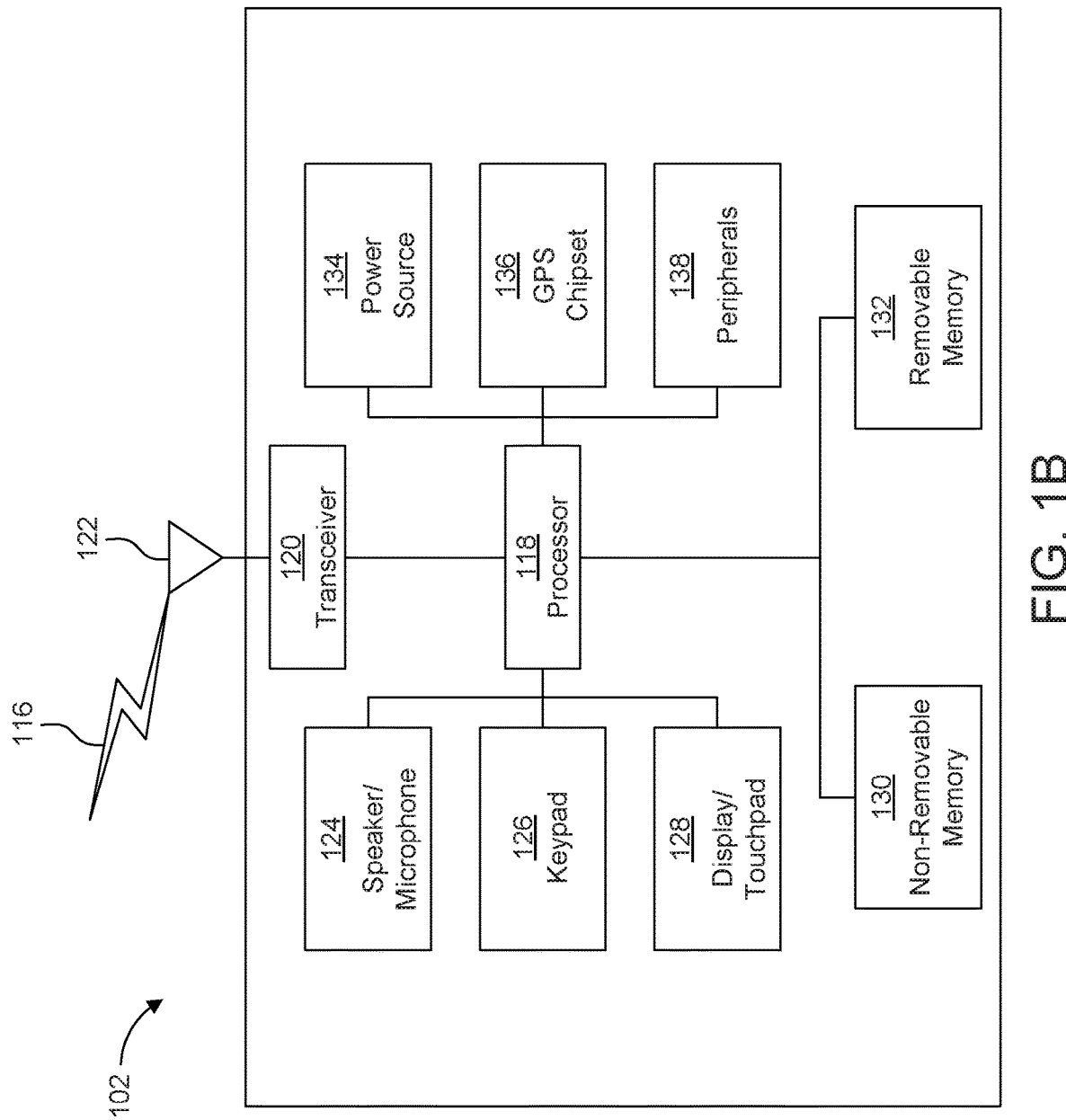
FIG. 1B is a system diagram illustrating an example wireless transmit/receive unit (WTRU) that may be used within the communications system illustrated in FIG. 1A according to an embodiment.

FIG. 1A is a diagram illustrating an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), zero-tail unique-word discrete Fourier transform Spread OFDM (ZT-UW-DFT-S-OFDM), unique word OFDM (UW-OFDM), resource block-filtered OFDM, filter bank multicarrier (FBMC), and the like.

As shown in FIG. 1A, the communications system 100 may include wireless transmit/receive units (WTRUs) 102a, 102b, 102c, 102d, a radio access network (RAN) 104, a core network (CN) 106, a public switched telephone network (PSTN) 108, the Internet 110, and other networks 112, though it will be appreciated that the disclosed embodiments contemplate any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d, any of which may be referred to as a station (STA), may be configured to transmit and/or receive wireless signals and may include a user equipment (UE), a mobile station, a fixed or mobile subscriber unit, a subscription-based unit, a pager, a cellular telephone, a personal digital assistant (PDA), a smartphone, a laptop, a netbook, a personal computer, a wireless sensor, a hotspot or Mi-Fi device, an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. Any of the WTRUs 102a, 102b, 102c and 102d may be interchangeably referred to as a UE.

The communications systems 100 may also include a base station 114a and/or a base station 114b. Each of the base stations 114a, 114b may be any type of device configured to wirelessly interface with at least one of the WTRUs 102a, 102b, 102c, 102d to facilitate access to one or more communication networks, such as the CN 106, the Internet 110, and/or the other networks 112. By way of example, the base stations 114a, 114b may be a base transceiver station (BTS), a NodeB, an eNode B (eNB), a Home Node B, a Home eNode B, a next generation NodeB, such as a gNode B (gNB), a new radio (NR) NodeB, a site controller, an access point (AP), a wireless router, and the like. While the base stations 114a, 114b are each depicted as a single element, it will be appreciated that the base stations 114a, 114b may include any number of interconnected base stations and/or network elements.

The base station 114a may be part of the RAN 104, which may also include other base stations and/or network elements (not shown), such as a base station controller (BSC), a radio network controller (RNC), relay nodes, and the like. The base station 114a and/or the base station 114b may be configured to transmit and/or receive wireless signals on one or more carrier frequencies, which may be referred to as a cell (not shown). These frequencies may be in licensed spectrum, unlicensed spectrum, or a combination of licensed and unlicensed spectrum. A cell may provide coverage for a wireless service to a specific geographical area that may be relatively fixed or that may change over time. The cell may further be divided into cell sectors. For example, the cell associated with the base station 114a may be divided into three sectors. Thus, in one embodiment, the base station 114a may include three transceivers, i.e., one for each sector of the cell. In an embodiment, the base station 114a may employ multiple-input multiple output (MIMO) technology and may utilize multiple transceivers for each sector of the cell. For example, beamforming may be used to transmit and/or receive signals in desired spatial directions.

The base stations 114a, 114b may communicate with one or more of the WTRUs 102a, 102b, 102c, 102d over an air interface 116, which may be any suitable wireless communication link (e.g., radio frequency (RF), microwave, centimeter wave, micrometer wave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114a in the RAN 104 and the WTRUs 102a, 102b, 102c may implement a radio technology such as Universal Mobile Telecommunications System (UMTS) Terrestrial Radio Access (UTRA), which may establish the air interface 116 using wideband CDMA (WCDMA). WCDMA may include communication protocols such as High-Speed Packet Access (HSPA) and/or Evolved HSPA (HSPA+). HSPA may include High-Speed Downlink (DL) Packet Access (HSDPA) and/or High-Speed Uplink (UL) Packet Access (HSUPA).

In an embodiment, the base station 114a and the WTRUs 102a, 102b, 102c may implement a radio technology such as Evolved UMTS Terrestrial Radio Access (E-UTRA), which may establish the air interface 116 using Long Term Evolution (LTE) and/or LTE-Advanced (LTE-A) and/or LTE-Advanced Pro (LTE-A Pro).

In an embodiment, the base station 114a and the WTRUs 102a, 102b, 102c may implement a radio technology such as NR Radio Access, which may establish the air interface 116 using NR.

In an embodiment, the base station 114a and the WTRUs 102a, 102b, 102c may implement multiple radio access technologies. For example, the base station 114a and the WTRUs 102a, 102b, 102c may implement LTE radio access and NR radio access together, for instance using dual connectivity (DC) principles. Thus, the air interface utilized by WTRUs 102a, 102b, 102c may be characterized by multiple types of radio access technologies and/or transmissions sent to/from multiple types of base stations (e.g., an eNB and a gNB).

In other embodiments, the base station 114a and the WTRUs 102a, 102b, 102c may implement radio technologies such as IEEE 802.11 (i.e., Wireless Fidelity (WiFi), IEEE 802.16 (i.e., Worldwide Interoperability for Microwave Access (WiMAX)), CDMA2000, CDMA2000 1x, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114b in FIG. 1A may be a wireless router, Home Node B, Home eNode B, or access point, for example, and may utilize any suitable RAT for facilitating wireless connectivity in a localized area, such as a place of business, a home, a vehicle, a campus, an industrial facility, an air corridor (e.g., for use by drones), a roadway, and the like. In one embodiment, the base station 114b and the WTRUs 102c, 102d may implement a radio technology such as IEEE 802.11 to establish a wireless local area network (WLAN). In an embodiment, the base station 114b and the WTRUs 102c, 102d may implement a radio technology such as IEEE 802.15 to establish a wireless personal area network (WPAN). In yet another embodiment, the base station 114b and the WTRUs 102c, 102d may utilize a cellular-based RAT (e.g., WCDMA, CDMA2000, GSM, LTE, LTE-A, LTE-A Pro, NR etc.) to establish a picocell or femtocell. As shown in FIG. 1A, the base station 114b may have a direct connection to the Internet 110. Thus, the base station 114b may not be required to access the Internet 110 via the CN 106.

The RAN 104 may be in communication with the CN 106, which may be any type of network configured to provide voice, data, applications, and/or voice over internet protocol (VoIP) services to one or more of the WTRUs 102a, 102b, 102c, 102d. The data may have varying quality of service (QoS) requirements, such as differing throughput requirements, latency requirements, error tolerance requirements, reliability requirements, data throughput requirements, mobility requirements, and the like. The CN 106 may provide call control, billing services, mobile location-based services, pre-paid calling, Internet connectivity, video distribution, etc., and/or perform high-level security functions, such as user authentication. Although not shown in FIG. 1A, it will be appreciated that the RAN 104 and/or the CN 106 may be in direct or indirect communication with other RANs that employ the same RAT as the RAN 104 or a different RAT. For example, in addition to being connected to the RAN 104, which may be utilizing a NR radio technology, the CN 106 may also be in communication with another RAN (not shown) employing a GSM, UMTS, CDMA 2000, WiMAX, E-UTRA, or WiFi radio technology.

The CN 106 may also serve as a gateway for the WTRUs 102a, 102b, 102c, 102d to access the PSTN 108, the Internet 110, and/or the other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and/or the internet protocol (IP) in the TCP/IP internet protocol suite. The networks 112 may include wired and/or wireless communications networks owned and/or operated by other service providers. For example, the networks 112 may include another CN connected to one or more RANs, which may employ the same RAT as the RAN 104 or a different RAT.

Some or all of the WTRUs 102a, 102b, 102c, 102d in the communications system 100 may include multi-mode capabilities (e.g., the WTRUs 102a, 102b, 102c, 102d may include multiple transceivers for communicating with different wireless networks over different wireless links). For example, the WTRU 102c shown in FIG. 1A may be configured to communicate with the base station 114a, which may employ a cellular-based radio technology, and with the base station 114b, which may employ an IEEE 802 radio technology.

FIG. 1B is a system diagram illustrating an example WTRU 102. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and/or other peripherals 138, among others. It will be appreciated that the WTRU 102 may include any sub-combination of the foregoing elements while remaining consistent with an embodiment.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs), any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one embodiment, the transmit/receive element 122 may be an antenna configured to transmit and/or receive RF signals. In an embodiment, the transmit/receive element 122 may be an emitter/detector configured to transmit and/or receive IR, UV, or visible light signals, for example. In yet another embodiment, the transmit/receive element 122 may be configured to transmit and/or receive both RF and light signals. It will be appreciated that the transmit/receive element 122 may be configured to transmit and/or receive any combination of wireless signals.

Although the transmit/receive element 122 is depicted in FIG. 1B as a single element, the WTRU 102 may include any number of transmit/receive elements 122. More specifically, the WTRU 102 may employ MIMO technology. Thus, in one embodiment, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as NR and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD)

memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It will be appreciated that the WTRU 102 may acquire location information by way of any suitable location-determination method while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs and/or video), a universal serial bus (USB) port, a vibration device, a television transceiver, a hands free headset, a Bluetooth® module, a frequency modulated (FM) radio unit, a digital music player, a media player, a video game player module, an Internet browser, a Virtual Reality and/or Augmented Reality (VR/AR) device, an activity tracker, and the like. The peripherals 138 may include one or more sensors. The sensors may be one or more of a gyroscope, an accelerometer, a hall effect sensor, a magnetometer, an orientation sensor, a proximity sensor, a temperature sensor, a time sensor; a geolocation sensor, an altimeter, a light sensor, a touch sensor, a magnetometer, a barometer, a gesture sensor, a biometric sensor, a humidity sensor and the like.

The WTRU 102 may include a full duplex radio for which transmission and reception of some or all of the signals (e.g., associated with particular subframes for both the UL (e.g., for transmission) and DL (e.g., for reception) may be concurrent and/or simultaneous. The full duplex radio may include an interference management unit to reduce and or substantially eliminate self-interference via either hardware (e.g., a choke) or signal processing via a processor (e.g., a separate processor (not shown) or via processor 118). In an embodiment, the WTRU 102 may include a half-duplex radio for which transmission and reception of some or all of the signals (e.g., associated with particular subframes for either the UL (e.g., for transmission) or the DL (e.g., for reception)).

Figure 1C:
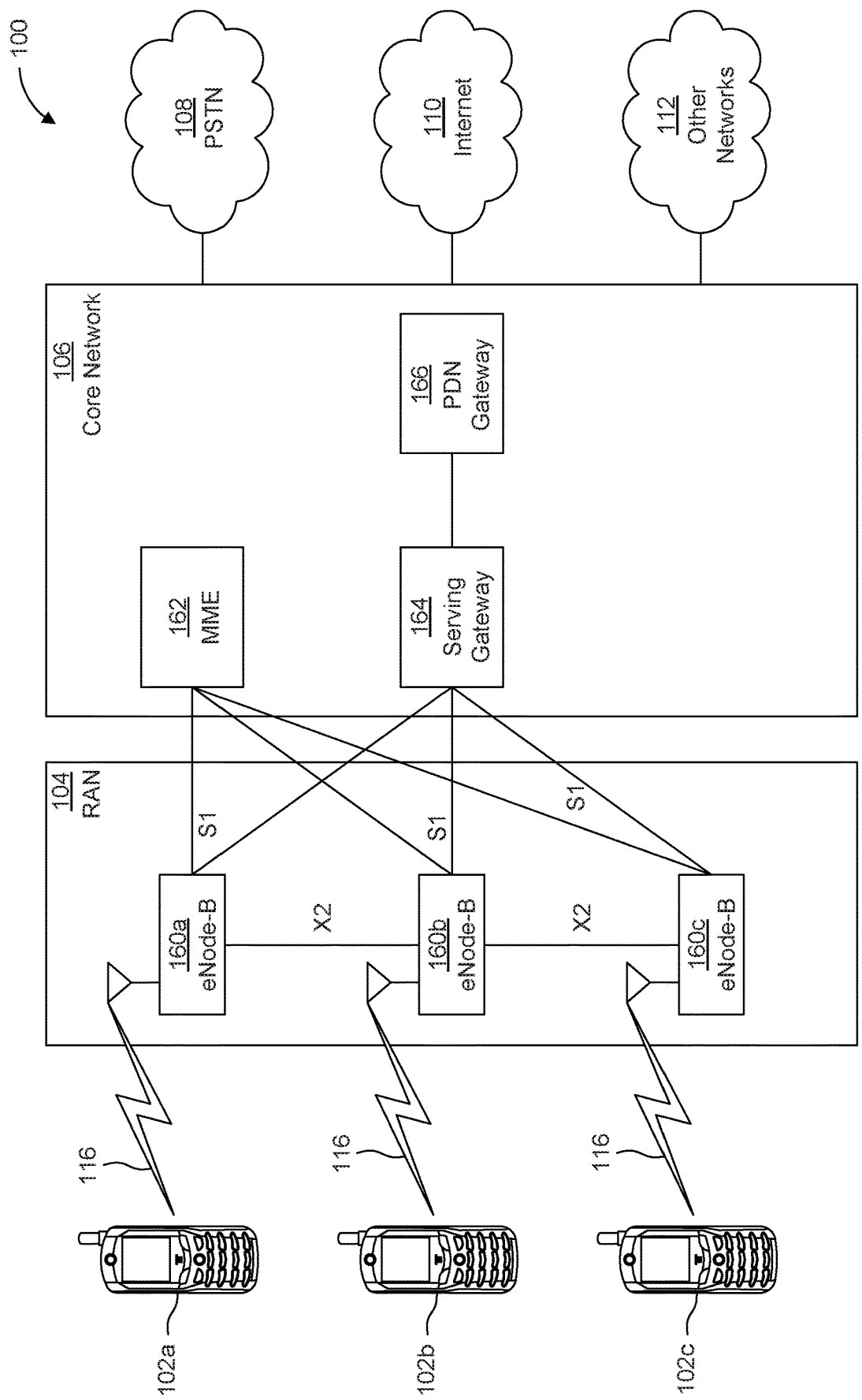
FIG. 1C is a system diagram illustrating an example radio access network (RAN) and an example core network (CN) that may be used within the communications system illustrated in FIG. 1A according to an embodiment.

FIG. 1C is a system diagram illustrating the RAN 104 and the CN 106 according to an embodiment. As noted above, the RAN 104 may employ an E-UTRA radio technology to communicate with the WTRUs 102a, 102b, 102c over the air interface 116. The RAN 104 may also be in communication with the CN 106.

The RAN 104 may include eNode-Bs 160a, 160b, 160c, though it will be appreciated that the RAN 104 may include any number of eNode-Bs while remaining consistent with an embodiment. The eNode-Bs 160a, 160b, 160c may each include one or more transceivers for communicating with the WTRUs 102a, 102b, 102c over the air interface 116. In one embodiment, the eNode-Bs 160a, 160b, 160c may implement MIMO technology. Thus, the eNode-B 160a, for example, may use multiple antennas to transmit wireless signals to, and/or receive wireless signals from, the WTRU 102a.

Each of the eNode-Bs 160a, 160b, 160c may be associated with a particular cell (not shown) and may be configured to handle radio resource management decisions, handover decisions, scheduling of users in the UL and/or DL, and the like. As shown in FIG. 1C, the eNode-Bs 160a, 160b, 160c may communicate with one another over an X2 interface.

The CN 106 shown in FIG. 1C may include a mobility management entity (MME) 162, a serving gateway (SGW) 164, and a packet data network (PDN) gateway (PGW) 166. While the foregoing elements are depicted as part of the CN 106, it will be appreciated that any of these elements may be owned and/or operated by an entity other than the CN operator.

The MME 162 may be connected to each of the eNode-Bs 162a, 162b, 162c in the RAN 104 via an S1 interface and may serve as a control node. For example, the MME 162 may be responsible for authenticating users of the WTRUs 102a, 102b, 102c, bearer activation/deactivation, selecting a particular serving gateway during an initial attach of the WTRUs 102a, 102b, 102c, and the like. The MME 162 may provide a control plane function for switching between the RAN 104 and other RANs (not shown) that employ other radio technologies, such as GSM and/or WCDMA.

The SGW 164 may be connected to each of the eNode Bs 160a, 160b, 160c in the RAN 104 via the S1 interface. The SGW 164 may generally route and forward user data packets to/from the WTRUs 102a, 102b, 102c. The SGW 164 may perform other functions, such as anchoring user planes during inter-eNode B handovers, triggering paging when DL data is available for the WTRUs 102a, 102b, 102c, managing and storing contexts of the WTRUs 102a, 102b, 102c, and the like.

The SGW 164 may be connected to the PGW 166, which may provide the WTRUs 102a, 102b, 102c with access to packet-switched networks, such as the Internet 110, to facilitate communications between the WTRUs 102a, 102b, 102c and IP-enabled devices.

The CN 106 may facilitate communications with other networks. For example, the CN 106 may provide the WTRUs 102a, 102b, 102c with access to circuit-switched networks, such as the PSTN 108, to facilitate communications between the WTRUs 102a, 102b, 102c and traditional land-line communications devices. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers.

Although the WTRU is described in FIGS. 1A-1D as a wireless terminal, it is contemplated that in certain representative embodiments that such a terminal may use (e.g., temporarily or permanently) wired communication interfaces with the communication network.

In representative embodiments, the other network 112 may be a WLAN.

A WLAN in Infrastructure Basic Service Set (BSS) mode may have an Access Point (AP) for the BSS and one or more stations (STAs) associated with the AP. The AP may have access or an interface to a Distribution System (DS) or another type of wired/wireless network that carries traffic in to and/or out of the BSS. Traffic to STAs that originates from outside the BSS may arrive through the AP and may be delivered to the STAs. Traffic originating from STAs to destinations outside the BSS may be sent to the AP to be delivered to respective destinations. Traffic between STAs within the BSS may be sent through the AP, for example, where the source STA may send traffic to the AP and the AP may deliver the traffic to the destination STA. The traffic between STAs within a BSS may be considered and/or referred to as peer-to-peer traffic. The peer-to-peer traffic may be sent between (e.g., directly between) the source and destination STAs with a direct link setup (DLS). In certain representative embodiments, the DLS may use an 802.11e DLS or an 802.11z tunneled DLS (TDLS). A WLAN using an Independent BSS (IBSS) mode may not have an AP, and the STAs (e.g., all of the STAs) within or using the IBSS may communicate directly with each other. The IBSS mode of communication may sometimes be referred to herein as an "ad-hoc" mode of communication.

When using the 802.11ac infrastructure mode of operation or a similar mode of operations, the AP may transmit a beacon on a fixed channel, such as a primary channel. The primary channel may be a fixed width (e.g., 20 MHz wide bandwidth) or a dynamically set width. The primary channel may be the operating channel of the BSS and may be used by the STAs to establish a connection with the AP. In certain representative embodiments, Carrier Sense Multiple Access with Collision Avoidance (CSMA/CA) may be implemented, for example in 802.11 systems. For CSMA/CA, the STAs (e.g., every STA), including the AP, may sense the primary channel. If the primary channel is sensed/detected and/or determined to be busy by a particular STA, the particular STA may back off. One STA (e.g., only one station) may transmit at any given time in a given BSS.

High Throughput (HT) STAs may use a 40 MHz wide channel for communication, for example, via a combination of the primary 20 MHz channel with an adjacent or nonadjacent 20 MHz channel to form a 40 MHz wide channel.

Very High Throughput (VHT) STAs may support 20 MHz, 40 MHz, 80 MHz, and/or 160 MHz wide channels. The 40 MHz, and/or 80 MHz, channels may be formed by combining contiguous 20 MHz channels. A 160 MHz channel may be formed by combining 8 contiguous 20 MHz channels, or by combining two non-contiguous 80 MHz channels, which may be referred to as an 80+80 configuration. For the 80+80 configuration, the data, after channel encoding, may be passed through a segment parser that may divide the data into two streams. Inverse Fast Fourier Transform (IFFT) processing, and time domain processing, may be done on each stream separately. The streams may be mapped on to the two 80 MHz channels, and the data may be transmitted by a transmitting STA. At the receiver of the receiving STA, the above described operation for the 80+80 configuration may be reversed, and the combined data may be sent to the Medium Access Control (MAC).

Sub 1 GHz modes of operation are supported by 802.11af and 802.11ah. The channel operating bandwidths, and carriers, are reduced in 802.11af and 802.11ah relative to those used in 802.11n, and 802.11ac. 802.11af supports 5 MHz, 10 MHz, and 20 MHz bandwidths in the TV White Space (TVWS) spectrum, and 802.11ah supports 1 MHz, 2 MHz, 4 MHz, 8 MHz, and 16 MHz bandwidths using non-TVWS spectrum. According to a representative embodiment, 802.11ah may support Meter Type Control/Machine-Type Communications (MTC), such as MTC devices in a macro coverage area. MTC devices may have certain capabilities, for example, limited capabilities including support for (e.g., only support for) certain and/or limited bandwidths. The MTC devices may include a battery with a battery life above a threshold (e.g., to maintain a very long battery life).

WLAN systems, which may support multiple channels, and channel bandwidths, such as 802.11n, 802.11ac, 802.11af, and 802.11ah, include a channel which may be designated as the primary channel. The primary channel may have a bandwidth equal to the largest common operating bandwidth supported by all STAs in the BSS. The bandwidth of the primary channel may be set and/or limited by a STA, from among all STAs in operating in a BSS, which supports the smallest bandwidth operating mode. In the example of 802.11ah, the primary channel may be 1 MHz wide for STAs (e.g., MTC type devices) that support (e.g., only support) a 1 MHz mode, even if the AP, and other STAs in the BSS support 2 MHz, 4 MHz, 8 MHz, 16 MHz, and/or other channel bandwidth operating modes. Carrier sensing and/or Network Allocation Vector (NAV) settings may depend on the status of the primary channel. If the primary channel is busy, for example, due to a STA (which supports only a 1 MHz operating mode) transmitting to the AP, all available frequency bands may be considered busy even though a majority of the available frequency bands remains idle.

In the United States, the available frequency bands, which may be used by 802.11ah, are from 902 MHz to 928 MHz. In Korea, the available frequency bands are from 917.5 MHz to 923.5 MHz. In Japan, the available frequency bands are from 916.5 MHz to 927.5 MHz. The total bandwidth available for 802.11ah is 6 MHz to 26 MHz depending on the country code.

Figure 1D:
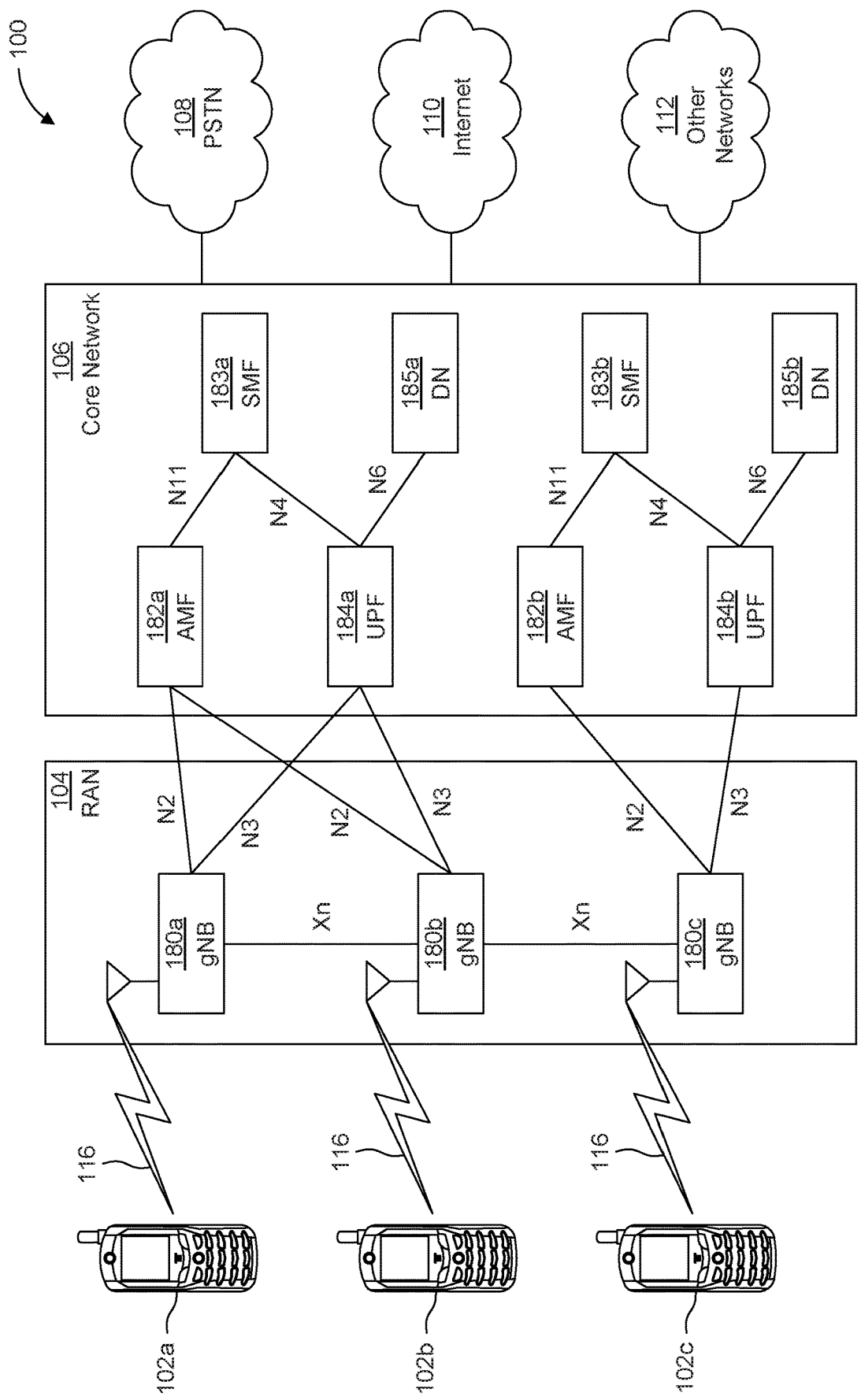
FIG. 1D is a system diagram illustrating a further example RAN and a further example CN that may be used within the communications system illustrated in FIG. 1A according to an embodiment.

FIG. 1D is a system diagram illustrating the RAN 104 and the CN 106 according to an embodiment. As noted above, the RAN 104 may employ an NR radio technology to communicate with the WTRUs 102a, 102b, 102c over the air interface 116. The RAN 104 may also be in communication with the CN 106.

The RAN 104 may include gNBs 180a, 180b, 180c, though it will be appreciated that the RAN 104 may include any number of gNBs while remaining consistent with an embodiment. The gNBs 180a, 180b, 180c may each include one or more transceivers for communicating with the WTRUs 102a, 102b, 102c over the air interface 116. In one embodiment, the gNBs 180a, 180b, 180c may implement MIMO technology. For example, gNBs 180a, 108b may utilize beamforming to transmit signals to and/or receive signals from the gNBs 180a, 180b, 180c. Thus, the gNB 180a, for example, may use multiple antennas to transmit wireless signals to, and/or receive wireless signals from, the WTRU 102a. In an embodiment, the gNBs 180a, 180b, 180c may implement carrier aggregation technology. For example, the gNB 180a may transmit multiple component carriers to the WTRU 102a (not shown). A subset of these component carriers may be on unlicensed spectrum while the remaining component carriers may be on licensed spectrum. In an embodiment, the gNBs 180a, 180b, 180c may implement Coordinated Multi-Point (CoMP) technology. For example, WTRU 102a may receive coordinated transmissions from gNB 180a and gNB 180b (and/or gNB 180c).

The WTRUs 102a, 102b, 102c may communicate with gNBs 180a, 180b, 180c using transmissions associated with a scalable numerology. For example, the OFDM symbol spacing and/or OFDM subcarrier spacing may vary for different transmissions, different cells, and/or different portions of the wireless transmission spectrum. The WTRUs 102a, 102b, 102c may communicate with gNBs 180a, 180b, 180c using subframe or transmission time intervals (TTIs) of various or scalable lengths (e.g., containing a varying number of OFDM symbols and/or lasting varying lengths of absolute time).

The gNBs 180a, 180b, 180c may be configured to communicate with the WTRUs 102a, 102b, 102c in a standalone configuration and/or a non-standalone configuration. In the standalone configuration, WTRUs 102a, 102b, 102c may communicate with gNBs 180a, 180b, 180c without also accessing other RANs (e.g., such as eNode-Bs 160a, 160b, 160c). In the standalone configuration, WTRUs 102a, 102b, 102c may utilize one or more of gNBs 180a, 180b, 180c as a mobility anchor point. In the standalone configuration, WTRUs 102a, 102b, 102c may communicate with gNBs 180a, 180b, 180c using signals in an unlicensed band. In a non-standalone configuration WTRUs 102a, 102b, 102c may communicate with/connect to gNBs 180a, 180b, 180c while also communicating with/connecting to another RAN such as eNode-Bs 160a, 160b, 160c. For example, WTRUs 102a, 102b, 102c may implement DC principles to communicate with one or more gNBs 180a, 180b, 180c and one or more eNode-Bs 160a, 160b, 160c substantially simultaneously. In the non-standalone configuration, eNode-Bs 160a, 160b, 160c may serve as a mobility anchor for WTRUs 102a, 102b, 102c and gNBs 180a, 180b, 180c may provide additional coverage and/or throughput for servicing WTRUs 102a, 102b, 102c.

Each of the gNBs 180a, 180b, 180c may be associated with a particular cell (not shown) and may be configured to handle radio resource management decisions, handover decisions, scheduling of users in the UL and/or DL, support of network slicing, DC, interworking between NR and E-UTRA, routing of user plane data towards User Plane Function (UPF) 184a, 184b, routing of control plane information towards Access and Mobility Management Function (AMF) 182a, 182b and the like. As shown in FIG. 1D, the gNBs 180a, 180b, 180c may communicate with one another over an Xn interface.

The CN 106 shown in FIG. 1D may include at least one AMF 182a, 182b, at least one UPF 184a, 184b, at least one Session Management Function (SMF) 183a, 183b, and possibly a Data Network (DN) 185a, 185b. While the foregoing elements are depicted as part of the CN 106, it will be appreciated that any of these elements may be owned and/or operated by an entity other than the CN operator.

The AMF 182a, 182b may be connected to one or more of the gNBs 180a, 180b, 180c in the RAN 104 via an N2 interface and may serve as a control node. For example, the AMF 182a, 182b may be responsible for authenticating users of the WTRUs 102a, 102b, 102c, support for network slicing (e.g., handling of different protocol data unit (PDU) sessions with different requirements), selecting a particular SMF 183a, 183b, management of the registration area, termination of non-access stratum (NAS) signaling, mobility management, and the like. Network slicing may be used by the AMF 182a, 182b in order to customize CN support for WTRUs 102a, 102b, 102c based on the types of services being utilized WTRUs 102a, 102b, 102c. For example, different network slices may be established for different use cases such as services relying on ultra-reliable low latency (URLLC) access, services relying on enhanced massive mobile broadband (eMBB) access, services for MTC access, and the like. The AMF 182a, 182b may provide a control plane function for switching between the RAN 104 and other RANs (not shown) that employ other radio technologies, such as LTE, LTE-A, LTE-A Pro, and/or non-3GPP access technologies such as WiFi.

The SMF 183a, 183b may be connected to an AMF 182a, 182b in the CN 106 via an N11 interface. The SMF 183a, 183b may also be connected to a UPF 184a, 184b in the CN 106 via an N4 interface. The SMF 183a, 183b may select and control the UPF 184a, 184b and configure the routing of traffic through the UPF 184a, 184b. The SMF 183a, 183b may perform other functions, such as managing and allocating UE IP address, managing PDU sessions, controlling policy enforcement and QoS, providing DL data notifications, and the like. A PDU session type may be IP-based, non-IP based, Ethernet-based, and the like.

The UPF 184a, 184b may be connected to one or more of the gNBs 180a, 180b, 180c in the RAN 104 via an N3 interface, which may provide the WTRUs 102a, 102b, 102c with access to packet-switched networks, such as the Internet 110, to facilitate communications between the WTRUs 102a, 102b, 102c and IP-enabled devices. The UPF 184, 184b may perform other functions, such as routing and forwarding packets, enforcing user plane policies, supporting multi-homed PDU sessions, handling user plane QoS, buffering DL packets, providing mobility anchoring, and the like.

The CN 106 may facilitate communications with other networks. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers. In one embodiment, the WTRUs 102a, 102b, 102c may be connected to a local DN 185a, 185b through the UPF 184a, 184b via the N3 interface to the UPF 184a, 184b and an N6 interface between the UPF 184a, 184b and the DN 185a, 185b.

In view of FIGS. 1A-1D, and the corresponding description of FIGS. 1A-1D, one or more, or all, of the functions described herein with regard to one or more of: WTRU 102a-d, Base Station 114a-b, eNode-B 160a-c, MME 162, SGW 164, PGW 166, gNB 180a-c, AMF 182a-b, UPF 184a-b, SMF 183a-b, DN 185a-b, and/or any other device(s) described herein, may be performed by one or more emulation devices (not shown). The emulation devices may be one or more devices configured to emulate one or more, or all, of the functions described herein. For example, the emulation devices may be used to test other devices and/or to simulate network and/or WTRU functions.

The emulation devices may be designed to implement one or more tests of other devices in a lab environment and/or in an operator network environment. For example, the one or more emulation devices may perform the one or more, or all, functions while being fully or partially implemented and/or deployed as part of a wired and/or wireless communication network in order to test other devices within the communication network. The one or more emulation devices may perform the one or more, or all, functions while being temporarily implemented/deployed as part of a wired and/or wireless communication network. The emulation device may be directly coupled to another device for purposes of testing and/or performing testing using over-the-air wireless communications.

The one or more emulation devices may perform the one or more, including all, functions while not being implemented/deployed as part of a wired and/or wireless communication network. For example, the emulation devices may be utilized in a testing scenario in a testing laboratory and/or a non-deployed (e.g., testing) wired and/or wireless communication network in order to implement testing of one or more components. The one or more emulation devices may be test equipment. Direct RF coupling and/or wireless communications via RF circuitry (e.g., which may include one or more antennas) may be used by the emulation devices to transmit and/or receive data.

The description herein relates to methods, devices, and systems for frequency division multiplexed On-Off Keying (OOK) signals for wake-up radios (WURs). One or more techniques may be utilized and are described herein, including aligning the Inverse Discrete Fourier Transform (IDFT) durations for low data rate (LDR) and high data rate (HDR) OOK signals; phase rotations for each wake-up radio (WUR) band; and/or using a Golay-based multi-band OOK waveform to control fluctuation of the signals in the time domain.

As described above, a WLAN in Infrastructure BSS mode has an AP for the BSS and one or more STAs associated with the AP. The AP may have access or interface to a Distribution System (DS) or another type of wired/wireless network that carries traffic in and out of the BSS. Traffic to STAs that originates from outside the BSS may arrive through the AP and may be delivered to the STAs. Traffic originating from STAs to destinations outside the BSS may be sent to the AP to be delivered to the respective destinations. Traffic between STAs within the BSS may also be sent through the AP, where the source STA may send traffic to the AP and the AP may deliver the traffic to the destination STA. The traffic between STAs within a BSS may be considered peer-to-peer traffic. The peer-to-peer traffic may also be sent directly between the source and destination STAs with a direct link setup (DLS) using an IEEE 802.11e DLS or an IEEE 802.11z tunneled DLS (TDLS).

A WLAN using an Independent BSS (IBSS) mode may have no AP, and/or STAs communicating directly with each other. This mode of communication is referred to as an "ad-hoc" mode of communication.

IEEE 802.11ba defines a physical layer specification and medium access control layer specification that enables operation of a wake-up radio (WUR) for IEEE 802.11 devices. Due to the low-power requirements of WUR, IEEE 802.11ba may adopt a basic non-coherent transmission scheme, rather than advanced schemes like OFDM. To this end, on-off keying (OOK) with Manchester coding, where a bit is represented with both on and off states at different durations, may be utilized. The main advantage of Manchester coding is that the receiver may detect a bit by comparing the energy of "on" and "off" durations or it may use an envelope detector. However, the "on" durations of the OOK signals may overlap in time domain. Thus, without any precaution, the multi-band operation may cause significant fluctuation in the time domain.

To improve spectral efficiency 802.11ac has introduced the concept for downlink Multi-User MIMO (MU-MIMO) transmission to multiple STA's in the same symbol's time frame, e.g. during a downlink OFDM symbol. The potential for the use of downlink MU-MIMO is also currently considered for 802.11ah. It is important to note that since downlink MU-MIMO, as it is used in 802.11ac, uses the same symbol timing to multiple STA's interference of the waveform transmissions to multiple STA's is not an issue. However, all STA's involved in MU-MIMO transmission with the AP must use the same channel or band, this limits the operating bandwidth to the smallest channel bandwidth that is supported by the STA's which are included in the MU-MIMO transmission with the AP.

IEEE 802.11ba defines a physical layer specification and medium access control layer specification that enables operation of a WUR for 802.11 devices. The Project Authorization Request (PAR) for 802.11ba includes the following requirements for range, capability, coexistence, power consumption, and latency.

With respect to range, the 802.11ba WUR may be a companion radio to the primary connectivity radio (e.g., 802.11ax) and may meet the same range requirement as the primary connectivity radio.

With respect to capability, the wake-up frames may carry only control information which can trigger a transition of the primary connectivity radio out of sleep.

With respect to coexistence, the WUR devices may coexist with legacy IEEE 802.11 devices in the same band.

With respect to power consumption, the WUR may have an expected active receiver power consumption of less than one milliwatt. Low power devices may manifest themselves in a number of applications and Internet-of-Things (IOT) usage cases. These use cases may include healthcare, smart home, industrial sensors, wearables, etc. Devices used in these applications are usually powered by a battery.

With respect to latency, prolonging the battery lifetime while in some use cases also maintaining low latency may become an imperative requirement. Power efficient mechanisms may need to be used with battery-operated devices while maintaining low latency where it is required. A typical OFDM active receiver may consume tens to hundreds of milliwatts. To further reduce power consumption, devices may use power save modes. Devices based on IEEE 802.11 power save modes may periodically wake up from a sleep state to receive information from an AP and to know if there are data to receive from the AP. The longer the devices stay in the sleep state, the lower the amount of power the devices may consume but at the expense of increased latency of data reception.

There may be several wake-up radio waveform options for a single channel. As noted above, due to the low-power requirements of WUR, IEEE 802.11ba may adopt a basic non-coherent transmission scheme, rather than advanced schemes like OFDM. To this end, on-off keying (OOK) with Manchester coding where a bit is represented with both on and off states at different durations may be utilized. The main advantage of Manchester coding is that the receiver can detect a bit by comparing the energy of "on" and "off" durations or it may use an envelope detector.

Figure 2A:
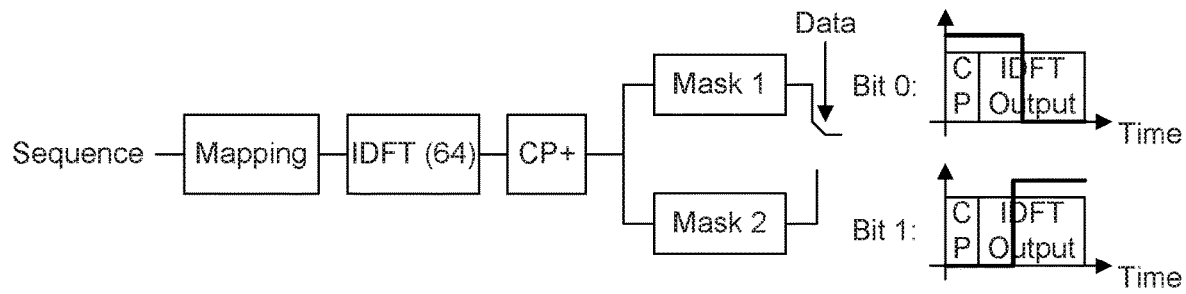
FIG. 2A shows a block diagram of a first masking approach for waveform generation methods for Manchester-coded on-off keying (OOK) symbols for a high data rate.
Figure 2B:
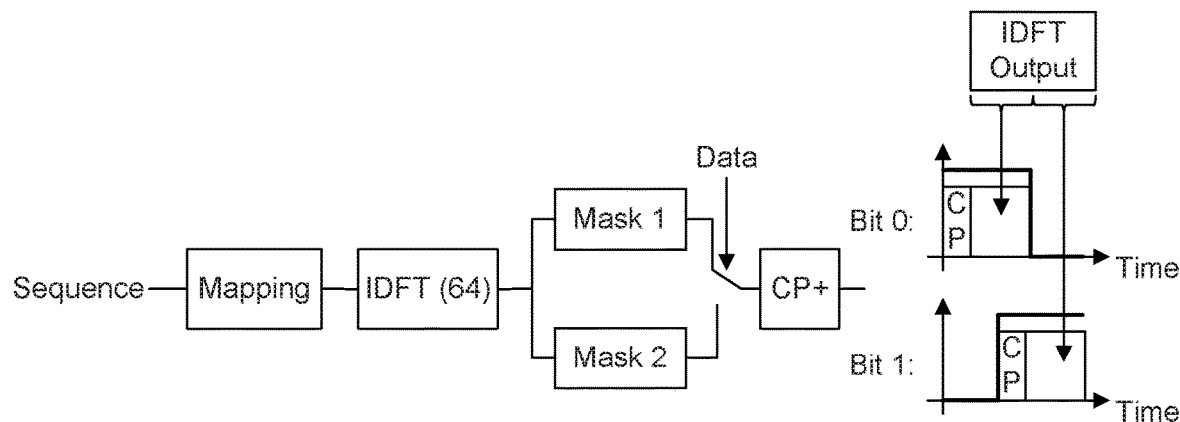
FIG. 2B shows a block diagram of a second masking approach for waveform generation methods for Manchester-coded OOK symbols for a high data rate.
Figure 2C:
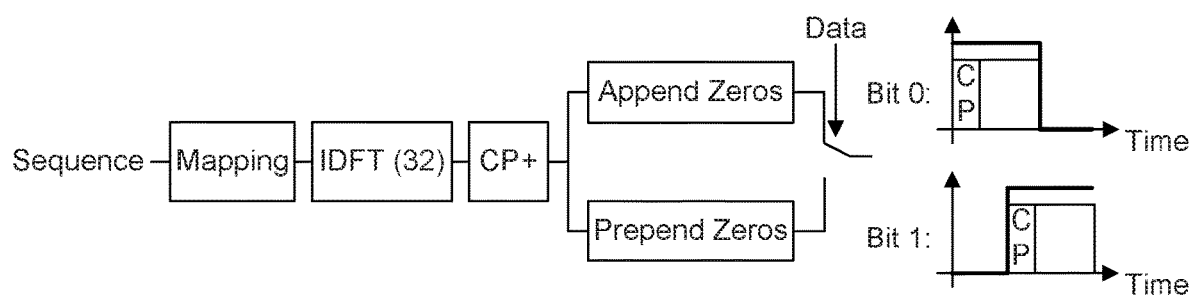
FIG. 2C shows a block diagram of a zero padding approach for waveform generation methods for Manchester-coded OOK symbols for a high data rate.

Referring now to FIGS. 2A-2C, diagrams showing several ways to generate corresponding waveforms for OOK symbols with Manchester coding for a high data rate (HDR) are shown. FIG. 2A shows a first masking approach. One of the approaches is to apply a mask on the basic OFDM symbol to represent the coded OOK bit "0" and "1". In this method, the basic idea of using a sequence (e.g., a part of legacy LTF sequence) may be used to generate an OFDM symbol. Then, the generated OFDM symbol may be masked after cyclic prefix (CP) insertion to generate the waveform.

FIG. 2B shows a second masking approach. The output of IDFT is masked before the CP insertion. A smaller CP duration, as compared to the one in FIG. 2A, is then prepended. The operation which generates a 2 μs 'On' duration in the waveform may be exemplified as follows. The 2 μs 'On' symbol may be constructed using a 64-point IFFT, sampling at 20-MHz as follows. Thirteen subcarriers may be used, (−6, −5, . . . −1, 0, 1, 2, . . . 6). The following subcarriers may be null: (−5, −3, −1, 0, 1, 3, 5). The other subcarriers may be selected from any of the following constellations: binary phase shift keying (BPSK), quadrature phase shift keying (QPSK), 16-QAM, 64-QAM, and 256-QAM. The first 32 values of the 64-point IFFT output may be selected, where the last 8 samples of those 32 samples may prepend to the 32 samples generating 40 samples, representing the 2 μs 'On' symbol.

FIG. 2C shows a third masking approach. This method may use a smaller IDFT operation and a smaller CP insertion to generate the "on" duration and zero padding. In this case, the sequence length may be smaller as compared to other cases (e.g., a length of 7).

Figure 3:
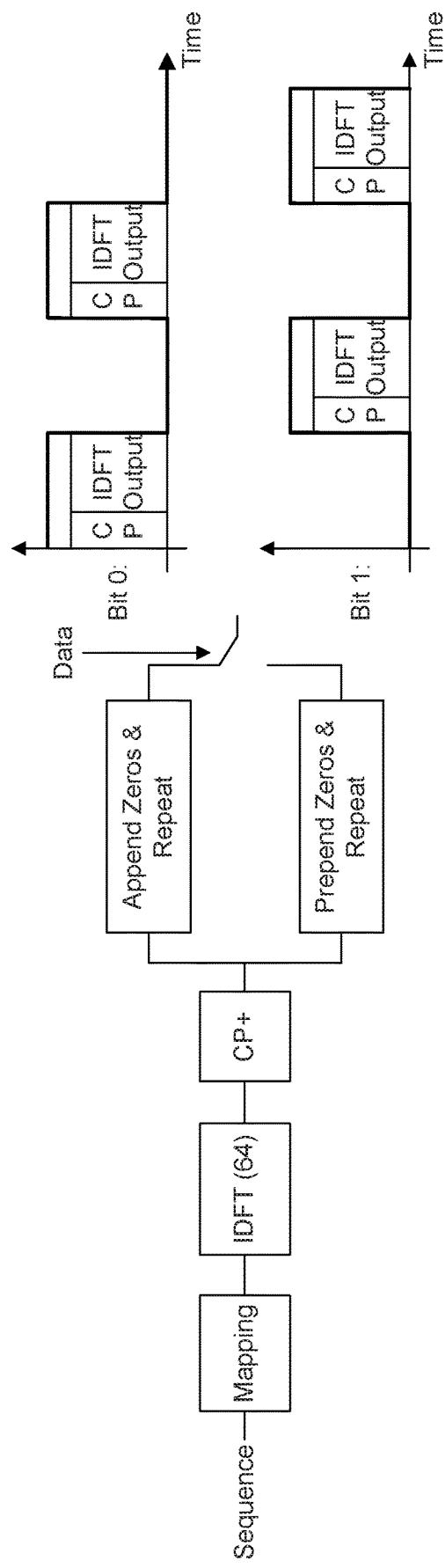
FIG. 3 shows a block diagram for a waveform generation method for Manchester-coded OOK symbols for a low data rate.

FIG. 3 shows waveform generation methods for Manchester-coded OOK symbols for a low data rate (LDR). For an LDR, the waveform structure may introduce more redundancy in time, such as by repetition. FIG. 3 illustrates that the CP prepended IDFT output may be transmitted two times at disjoint locations in time for different information. As a numerical example, the 4 μs 'On' durations in the waveform may be constructed using a 64-point IFFT, sampling at 20-MHz as follows. Thirteen subcarriers may be used, (−6, −5, . . . −1, 0, 1, 2, . . . 6). The DC subcarrier may be a null symbol. The other subcarriers may be selected from any of the following constellations: BPSK, QPSK, 16-QAM, 64-QAM, and 256-QAM. The last 16 values of the 64-point IFFT output may be prepended to the 64 samples generating 80 samples, representing the 4 μs 'On' symbol.

Figure 4A:
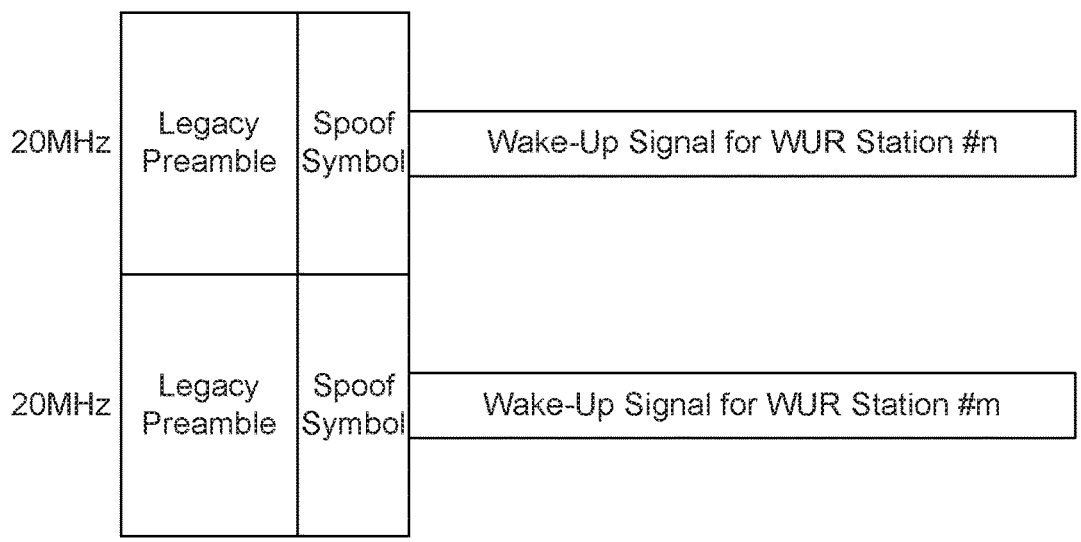
FIG. 4A shows transmitting wake-up signals for different wake-up radio stations in a multi-band 40 MHz operation.
Figure 4B:
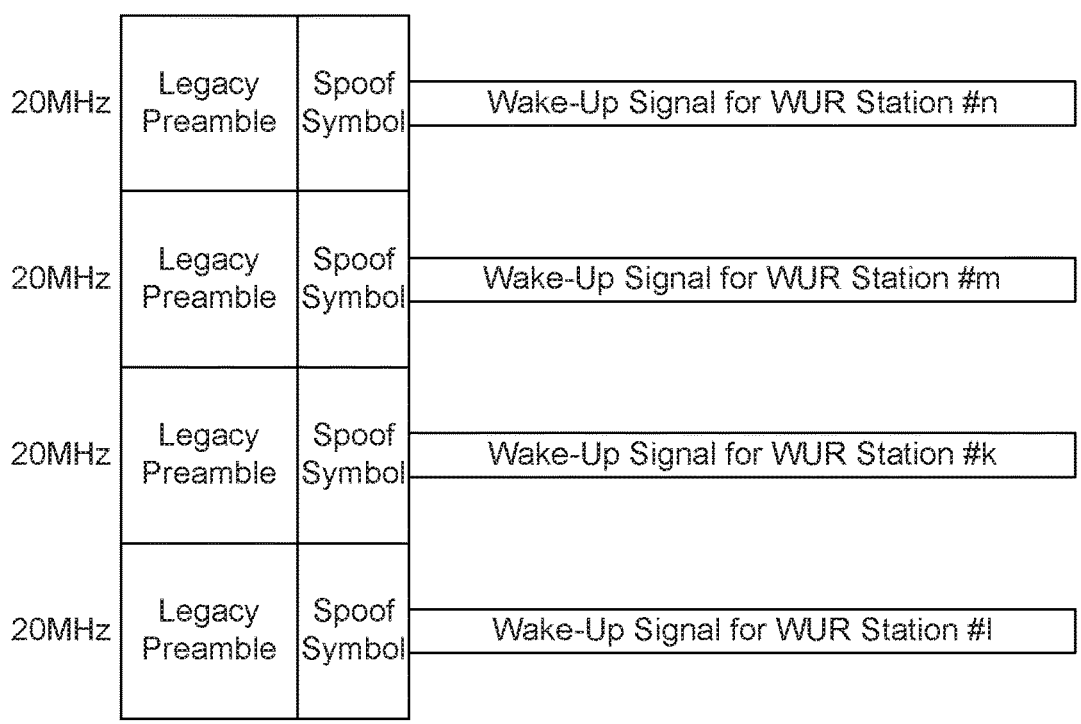
FIG. 4B shows transmitting wake-up signals for different wake-up radio stations in a multi-band 80 MHz operation.

In addition to options for a single channel, there may be several wake-up radio waveform options for a multiple channels. FIGS. 4A and 4B are directed to multi-band operations. FIG. 4A shows a WUS transmission in a 40 MHz operation. FIG. 4B shows a WUS transmission in a multi-band operation.

In one approach, a wake-up radio signal (WUS) may be transmitted in multiple 20 MHz channels. For example, two 20 MHz channels as shown in FIG. 4A, and four 40 MHz channels as shown in FIG. 4B, may be exploited to transmit two WUSs or four WUSs, respectively. Each channel may be either LDR and HDR. FIG. 4A shows a WUS for WUR station #n and a WUS for WUR station #m transmitted for each respective 20 MHz channel. FIG. 4B shows a WUS for WUR station #n, a WUS for WUR station #m, a WUS for WUR station #k, and a WUS for WUR station #N transmitted for each respective 20 MHz channel.

Certain terms used herein are defined below. For example, Aperiodic Auto Correlation (APAC) may be defined as follows.

Let $\rho_a(k)$ for $k \in [-N+1, N-1]$ be the aperiodic autocorrelation of a complex sequence $a=\{a_0, a_1, \ldots, a_{N-1}\}$ and $\rho_a(k)$ may be explicitly given by:

$$\rho_a(k) = \begin{cases} \rho_a^+(k), & k \in [0, N-1] \\ \rho_a^-(-k), & k \in [-N+1, -1] \end{cases}, \text{where} \qquad \text{Equation 1}$$

$$\rho_a^+(k) = \sum_{i=0}^{N-k-1} a_i^* a_{i+k}, 0 \le k \le N-1, \text{ and} \qquad \text{Equation 2}$$

$$\rho_a^-(k) = \sum_{i=0}^{N-k-1} a_i a_{i+k}^*, 1 \le k \le N-1, \qquad \text{Equation 3}$$

where (·)* may be the conjugate of its argument and $\rho_a^+(k) = [\rho_a^-(k)]^*$.

Periodic Auto Correlation (PAC) may be defined as follows.

Let $r_a(k)$ be the periodic autocorrelation of the sequence $a=\{a_0, a_1, \ldots, a_{N-1}\}$ and $r_a(k)$ may be explicitly given by:

$$r_a(k) \triangleq \sum_{i=0}^{N-1} a_i^* a_{(i+k)_N}, 0 \le k \le N-1, \qquad \text{Equation 4}$$

where $(i)_N$ may be the modulo of i.

Golay Complementary Sequences may be defined as follows.

The pair of (a, b) may be called a Golay complementary pair (and the sequences a and b may be called Golay sequences) if:

$$\rho_a(k) + \rho_b(k) = 0, k \ne 0. \qquad \text{Equation 5}$$

In telecommunication, Golay complementary pairs and sequences have been proposed for peak-to-average power mitigation, estimation of IQ imbalance parameters, and channel estimation due to its unique properties.

A time-domain power signal may be expressed as a function of APAC and limiting Peak-to-Average Power Ratio (PAPR) with Golay Sequences. For example, a sequence with a polynomial may be represented as follows:

$$x_a(z) = a_{N-1}z^{N-1} + a_{N-2}z^{N-2} + \ldots + a_0, \qquad \text{Equation 6}$$

where the sequence $a=[a_0, a_1, \ldots, a_{N-1}]$. Therefore, the following conclusions may be made.

If $z=e^{j2\pi t}$, $x_a(z)$ may be equivalent to OFDM signal in time (i.e., a Fourier transform of a).

If $z=e^{j2\pi t}$, the instantaneous power may be calculated as $|x_a(z)|^2 = x_a(z)x_{a*}(z^{-1})$ as $x_{a*}(z^{-1}) = x_a^*(z)$. If the instantaneous power is known, the PAPR may be measure.

The formula $|x_a(z)|^2 = x_a(z)x_{a*}(z^{-1})$ may be related to APAC of the sequence. It may be expressed as follows:

$$|x_a(z)|^2_{z=e^{j2\pi t}} \triangleq x_a(z)x_a*(z^{-1}) = \qquad \text{Equation 7}$$
$$\rho_a(0) + \sum_{k=1}^{N-1} \rho_a^+(k)z^k + \sum_{k=1}^{N-1} \rho_a^-(k)z^{-k}$$

$$= \rho_a(0) + \sum_{k=1}^{N-1} \rho_a^+(k)e^{j2\pi tk} + \sum_{k=1}^{N-1} \rho_a^-(k)e^{-j2\pi tk} \qquad \text{Equation 8}$$

$$= \rho_a(0) + 2\sum_{k=1}^{N-1} |\rho_a^+(k)|\cos(2\pi tk + \angle\rho_a^+(k)) = \sum_{k=-N+1}^{N-1} \rho_a(k)e^{j2\pi tk}. \qquad \text{Equation 9}$$

If the sequence has perfect APAC properties, $|x_a(e^{j2\pi t})|^2 = \rho_a(0)$ (i.e., a constant) holds true. This means the time domain signal may have to be unimodal in every point in time. By using the equation above, the PAPR of any sequence may be bounded as:

$$PAPR \triangleq \frac{\max(x_a(z)x_a^*(z^{-1}))}{E[x_a(z)x_a^*(z^{-1})]} < \frac{\rho_a(0) + 2\sum_{k=1}^{N-1} |\rho_a^+(k)|}{\rho_a(0)}, \qquad \text{Equation 10}$$

where E[·] may be the integration operation for t from 0 to 2π.

The PAPR may also be equivalently measured by two quantities: integrated side lobe level (ISL) and merit factor (MF) of a sequence, defined as:

$$ISL \triangleq \sum_{k=1}^{N-1} |\rho_a^+(k)|^2, \text{ and} \qquad \text{Equation 11}$$

$$MF \triangleq \frac{\rho_a^+(0)^2}{2\sum_{k=1}^{N} |\rho_a^+(k)|^2}, \text{ respectively.} \qquad \text{Equation 12}$$

The PAPR of a sequence in a complementary pair may be always less than 10 log 10(2) dB (i.e., less than or equal to approximately 3 dB). The proof may be as follows.

Since Golay pairs a and b satisfy $\rho_a(k)+\rho_b(k)=0$, $k\neq 0$, the following may hold true:

$$x_a(z)x_a^*(z^{-1}) + x_b(z)x_b^*(z^{-1}) = \rho_a(0) + \sum_{k=1}^{N-1} \rho_a^+(k)z^k + \qquad \text{Equation 13}$$

$$\rho_a^-(k)z^{-k} + \rho_b(0) + \sum_{k=1}^{N-1} \rho_b^+(k)z^k + \rho_b^-(k)z^{-k}$$

$$= \rho_a(0) + \rho_b(0) + \qquad \text{Equation 14}$$

$$\sum_{k=1}^{N-1}((\rho_a^+(k) + \rho_b^+(k))z^k + (\rho_a^-(k) + \rho_b^-(k))z^{-k}) =$$

$$\rho_a(0) + \rho_b(0) = 2N.$$

Thus, the PAPR of a Golay sequence may be bounded as:

$$PAPR = \frac{\max(x_a(z)x_a(z^{-1}))}{E[x_a(z)x_a(z^{-1})]} \leq \qquad \text{Equation 15}$$

$$\frac{\max(x_a(z)x_a(z^{-1}) + x_b(z)x_b(z^{-1}))}{E[x_a(z)x_a(z^{-1})]} = \frac{2N}{\rho_a(0)} = 2.$$

Golay complementary sequences may be constructed for larger lengths using, for example, Budisin's method. For example, the length $N=2^M$ Golay complementary pairs may be constructed by the following recursive procedure:

$$a_k^{(m)} = w_m a_k^{(m-1)} + b_{k-d_m}^{(m-1)} \qquad \text{Equation 16}$$

$$b_k^{(m)} = w_m a_k^{(m-1)} - b_{k-d_m}^{(m-1)} \qquad \text{Equation 17}$$

where $a_k^{(0)} = a_k^{(1)} = \delta_k$, $\delta_k$ may be the Kronecker's delta, and $w_m$ may be the mth element of rotation vector $w=[w_1\ w_2\ \ldots\ w_M]$, and where $|w_m|=1$, $d_m$ may be the mth element of the delay vector $d=[d_1\ d_2\ \ldots\ d_M]$ and the permutation of $[1\ 2\ \ldots\ 2^M]$.

For example, in IEEE 802.11ad, the pairs of Golay complementary sequences may be generated based on the method above and three pairs may be considered: $(Ga_{32}, Gb_{32})$, $(Ga_{64}, Gb_{64})$, and $(Ga_{128}, Gb_{128})$. The parameters of these pairs are listed as follows:

$$Ga_{32}=\text{flip}\{a_k^{(5)}\} \text{ and } Gb_{32}=\text{flip}\{b_k^{(5)}\}: \qquad \text{Equation 18}$$

$$w=[-1\ 1\ -1\ 1\ -1] \text{ and } d=[1\ 4\ 8\ 2\ 16] \qquad \text{Equation 19}$$

$$Ga_{64}=\text{flip}\{a_k^{(6)}\} \text{ and } Gb_{64}=\text{flip}\{b_k^{(6)}\}: \qquad \text{Equation 20}$$

$$w=[1\ 1\ -1\ -1\ 1\ -1] \text{ and } d=[2\ 1\ 4\ 8\ 16\ 32] \qquad \text{Equation 21}$$

$$Ga_{128}=\text{flip}\{a_k^{(7)}\} \text{ and } Gb_{128}=\text{flip}\{b_k^{(7)}\}: \qquad \text{Equation 22}$$

$$w=[-1\ -1\ -1\ -1\ 1\ -1\ -1] \text{ and } d=[1\ 8\ 2\ 4\ 16\ 32\ 64], \qquad \text{Equation 23}$$

where flip{·} reverses the order of its argument. In 802.11ad, the Golay sequences may not only be used in STF and CEF, they are also used in SC PHY ($Ga_{64}$) and low power SC PHY ($Ga_{64}$ and $G_8$) for guard interval (GI), as well as in beamforming training (TRN) field.

A Unified Property to Generate Golay Complementary Pair may be provided.

Property 1: Let a and b be Golay pairs of length N and c and d be Golay pairs of length M. Then, the following e and f sequence are Golay pairs of length $k(N-1)+l(M-1)+m+1$:

$$x_e(z) = w_1 x_a(z^k) x_c(z^l) + w_2 x_b(z^k) x_d(z^l) z^m \qquad \text{Equation 24}$$

$$x_f(z) = w_1 x_{\tilde{b}*}(z^k) x_c(z^l) - w_2 x_{\tilde{a}*}(z^k) x_d(z^l) z^m, \qquad \text{Equation 25}$$

where k, l, m are integer numbers, $w_1$ and $w_2$ are arbitrary complex numbers with unit amplitude, and $x_a(z^k)$ may be the upsampled sequence a with the factor of k, $x_a(z^k)x_b(z^l)$ may be the convolution of up-sampled sequence a with the factor of k and up-sampled sequence b with the factor of l, $x_a(z)z^m$ may be padded sequence a with m null symbols, $\tilde{b}$ may be the flipped vector b, and $\tilde{b}*$ may be conjugate of $\tilde{b}$.

Golay complementary sequences with the alphabet of $\{1, -1\}$ are known to exist for all lengths $N=2^n 10^m 26^k$ for any non-negative integers n, m and k. Golay complementary sequences up to length 13 are also known in the art.

Figure 5:
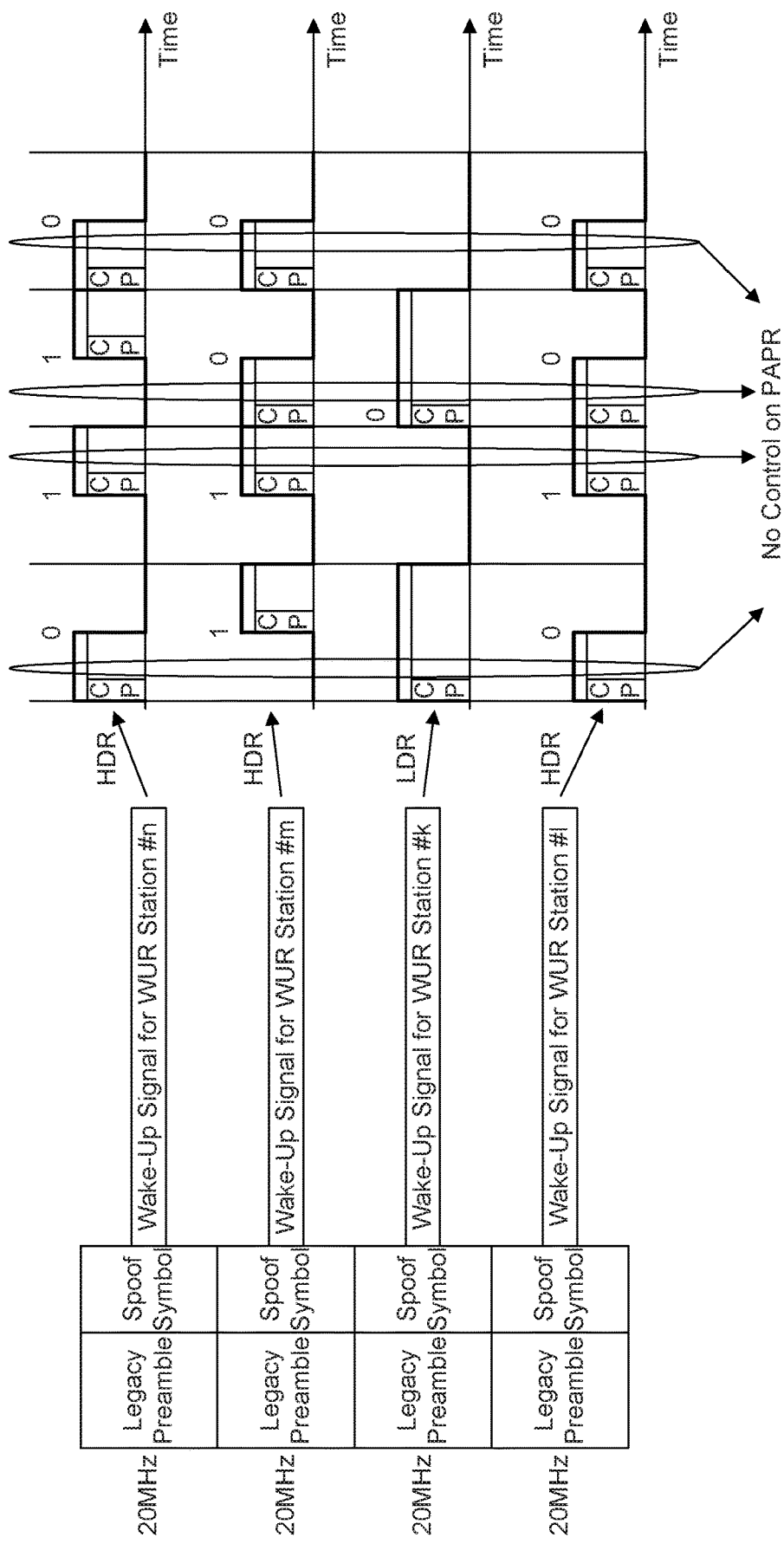
FIG. 5 shows overlapping "on" durations of OOK signals in a time domain.

Referring now to FIG. 5, a diagram illustrating WUSs multiplexed in the frequency domain. FIG. 5 shows that when WUSs are multiplexed in the frequency domain, the "On" durations of the OOK signals may overlap in the time domain. The left portion of FIG. 5 may be similar to the multi-band 80 MHz operation shown in FIG. 4B. Thus, without any precaution, the multi-band operation may cause significant fluctuation in the time domain.

To demonstrate the fluctuation, assume that the sequences in a first conventional approach (Approach 1) and the sequences in a second conventional approach (Approach 2) are considered for four channels where each channel consist of HDR WUSs.

Figure 6A:
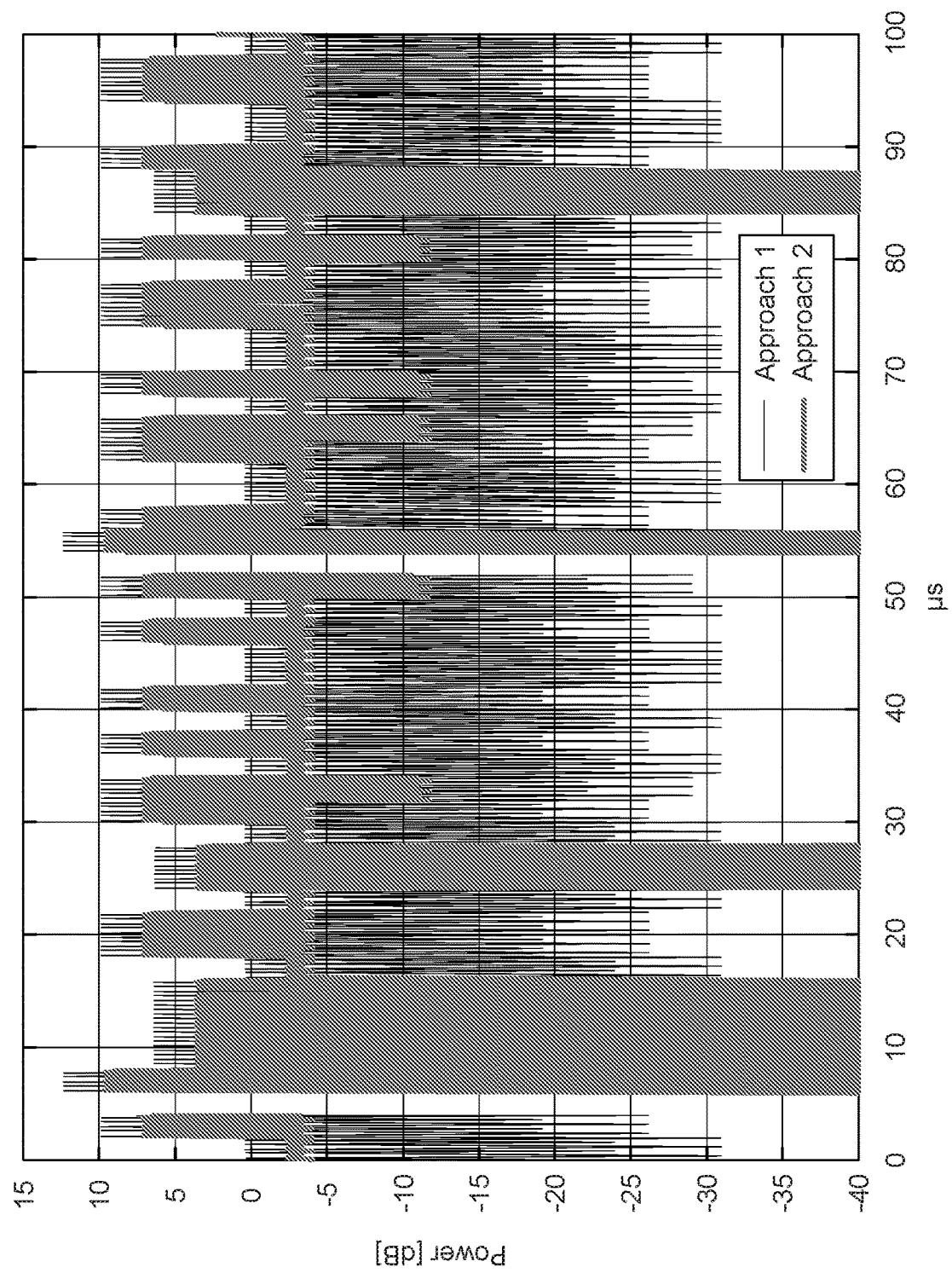
FIG. 6A shows generated signal when four channels, each with an high data rate (HDR) wake-up signal, are utilized.

An example of the transmitted multi-band signal and the corresponding PAPR distribution (measured at 2 μs periods) are given in FIGS. 6A and 6B, which are used to demonstrate the PAPR problem for multi-band operation. FIG. 6A shows a signal when four channels are utilized. FIG. 6B shows PAPR distribution when four channels are utilized. Each 20 MHz channel in FIGS. 6A-6B may have one HDR WUS.

As shown in FIG. 6A and FIG. 6B, the peak power may reach more than 12 dB above the average, which may lead to a reduced transmit power and coverage loss for WURs. Methods that reduce the PAPR for multi-band operation when considering mixed HDR and LDR traffic may be needed.

One or more techniques may be utilized to reduce the PAPR for multi-band operation when considering mixed HDR and LDR traffic and are described herein, including aligning the Inverse Discrete Fourier Transform (IDFT) durations for LDR and HDR OOK signals; phase rotations for each wake-up radio (WUR) band; and/or using a Golay-based multi-band OOK waveform to control fluctuation of the signals in the time domain.

Figure 7:
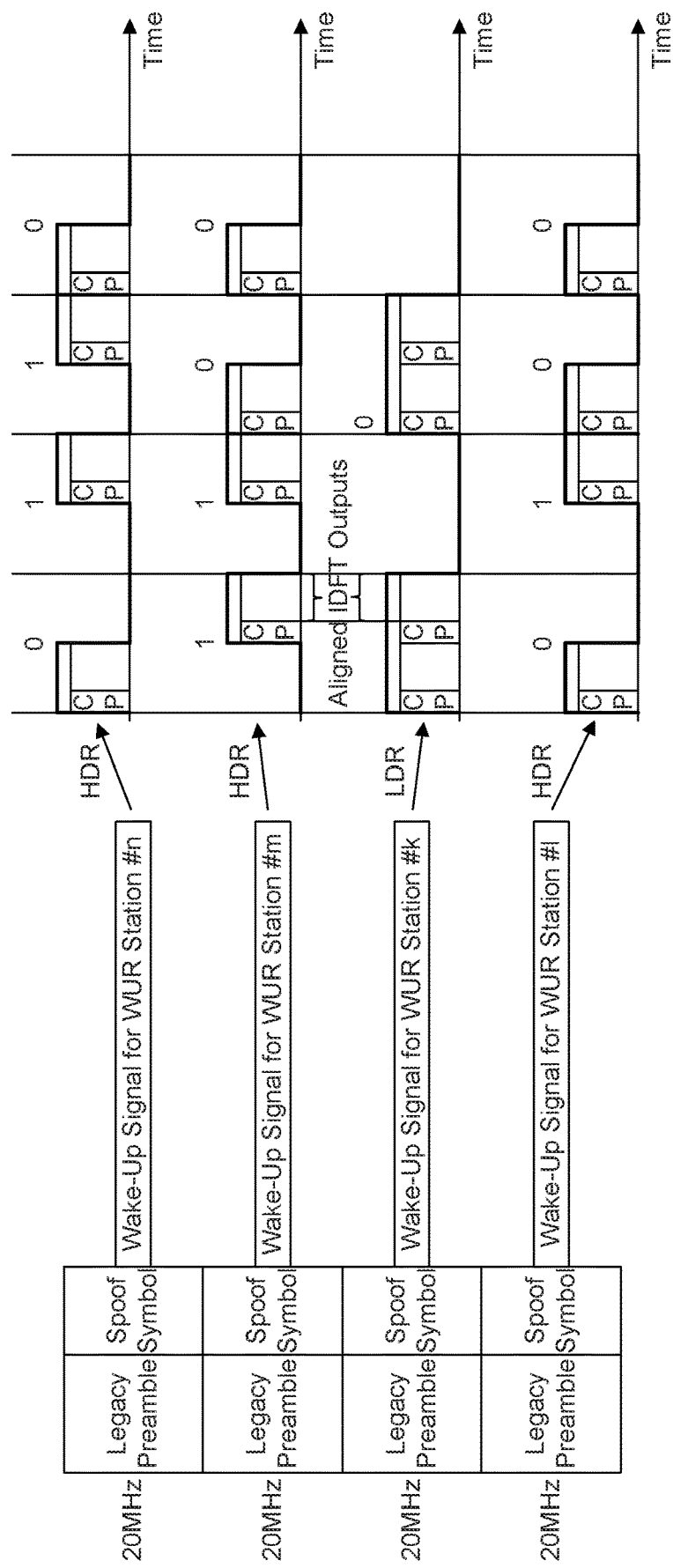
FIG. 7 shows aligning inverse discrete Fourier transform (IDFT) durations for low data rate (LDR) and HDR wake up signals (WUSs) according to one or more embodiments.

FIG. 7 shows aligning the IDFT durations for LDR and HDR WUSs. The left portion of FIG. 7 may be similar to the multi-band 80 MHz operation shown in FIG. 4B. FIG. 7 shows a multi-band operation where the first two channels and the fourth channel carry HDR WUS and the third channel carries LDR WUS.

Here, each "On" duration of the WUS for the third channel may have two OFDM symbols transmitted back-to-back. The second OFDM symbol on the third channel may be a repetition of the first OFDM symbol, a phase shifted version of the first OFDM symbol, or another OFDM symbol generated through a different sequence. This approach may align the symbol boundaries of OFDM symbols in time for different channels. The alignment may be beneficial to adjust the sequences on each channel to avoid of PAPR increase in case of multiband operation.

In one implementation, this may be shown as a type of coding for LDR cases. For example, bit 1 may be encoded as [1 1 0 0 1 1 0 0] and bit 0 may be encoded as [0 0 1 1 0 0 1 1] for LDR before the waveform generation. The symbol duration for LDR may be set to the one used for HDR. The encoding for HDR may be as follows: 1 may be encoded as [1 0] and bit 0 may be encoded as [0 1].

In another technique, phase rotations for each band may be used. Different phase rotations may be introduced to the sequences when they are mapped to different channels. For example, let $s \in \mathbb{C}^{7 \times 1}$ be a sequence optimized for single channel transmission for HDR. When the sequence may be for the $1^{st}$, $2^{nd}$, $3^{rd}$, and $4^{th}$ channels, the sequence s may be multiplied by $e^{j\theta_1}$, $e^{j\theta_2}$, $e^{j\theta_3}$, and $e^{j\theta_4}$, respectively, as illustrated in FIG. 8.

Figure 8:
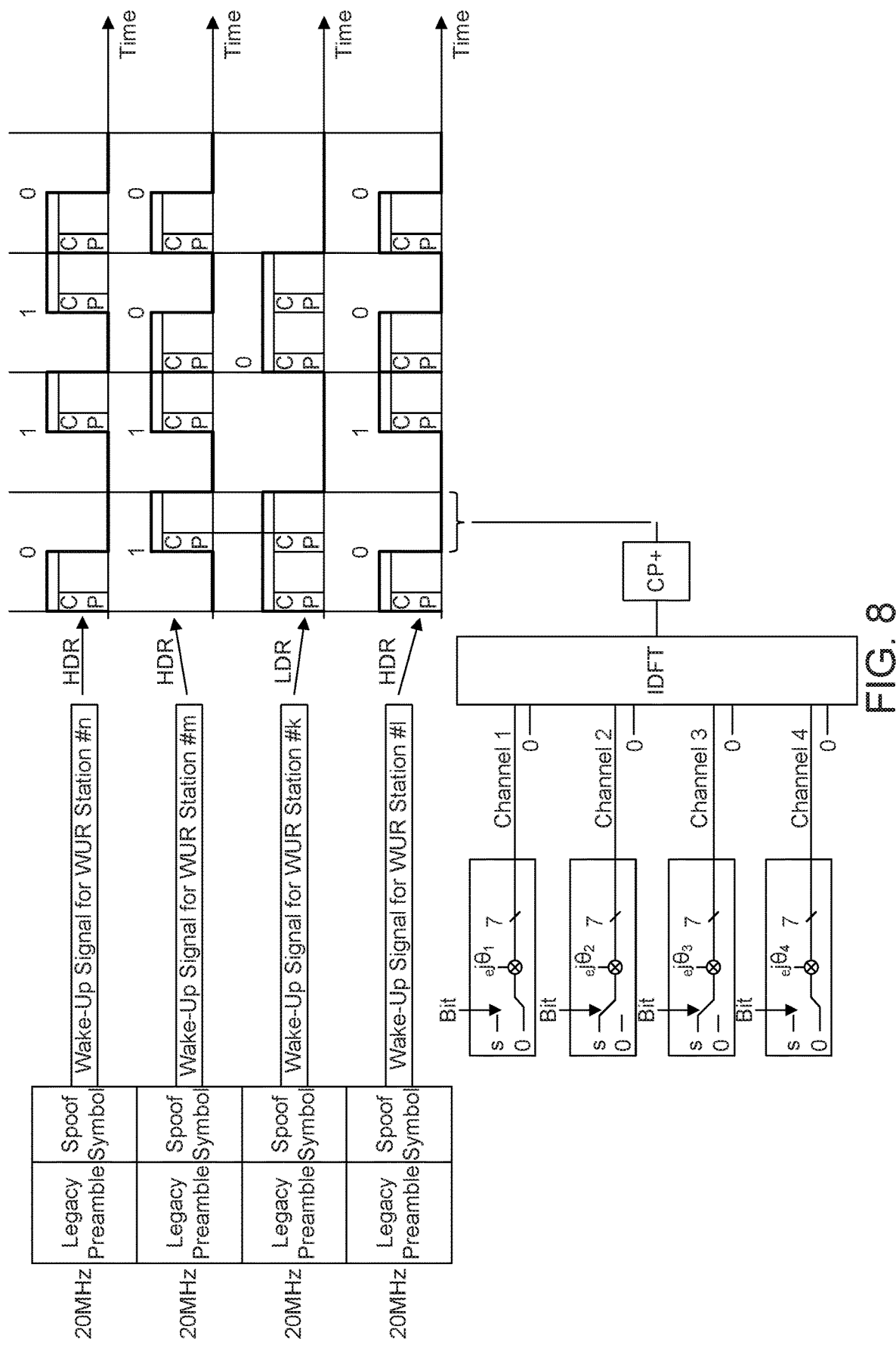
FIG. 8 shows applying phase rotations for different channels.

FIG. 8 shows and example of applying phase rotations for different channels, and the left portion of FIG. 8 may be similar to the multi-band 80 MHz operation shown in FIG. 4B. In one example, the difference between the phases may be given as:

$$\theta_{i+1} - \theta_i = \theta_{fixed}, \text{ e.g., } \theta_{fixed} = \frac{2\pi}{8}. \quad \text{Equation 26}$$

A different cyclic shift in time may be introduced to the signals generated for different channels. For example, the amount of the cyclic shift between different channels may be set to δt=100 ns to avoid of PAPR increase in time. This should not be confused with the cyclic shifts introduced to avoid unintentional beamforming for multiple antenna transmission case and may be chosen independently thereof.

In another technique, a Golay-based multi-band OOK waveform may be used to control fluctuation of the signals in the time domain. The sequences used for 'On' durations may be constructed based on the Golay sequences. To this end, a first step may be to generate a set of Golay sequence where the center tone may be 0. The rules for this set may be as follows.

Golay sequences may be constructed with a length of 7, where a and b are Golay pairs of length S=3. Then, $$x_e(z) = w_1 x_a(z^k) + w_2 x_b(z^k) z^{S+1} \text{ and} \quad \text{Equation 27}$$

$$x_f(z) = w_1 x_{\tilde{b}*}(z^k) - w_2 x_{\tilde{a}*}(z^k) z^{S+1} \quad \text{Equation 28}$$

may be Golay pairs of length of 7 based on the Property 1 provided above, where $w_1$ and $w_2$ are arbitrary complex numbers with unit amplitude. In other words, $$e = [w_1 a \ 0 \ w_2 b] \text{ and} \quad \text{Equation 29}$$

$$f = [w_1 \tilde{b}* \ 0 \ -w_2 \tilde{a}*] \quad \text{Equation 30}$$

may be new sequences and they complement each other as being a Golay complementary pair (i.e., Golay sequences) according to $\rho_a(k) + \rho_b(k) = 0$, k≠0. For example, a QPSK-based Golay pair a and b for the length of S=3 may be a=[1 1i 1] and b=[1 1 −1]. Other equivalent sequences (there may be 128 of them) may also be generated by applying operations like conjugations and flipping. Based on equations (1a) and (1b), and assuming $w_1$ and $w_2$ are 1, $$e=[1 \ 1i \ 1 \ 0 \ 1 \ 1 \ -1] \text{ and } f=[-1 \ 1 \ 1 \ 0 \ -1 \ 1i \ -1]. \quad \text{Equation 31}$$

Similarly, the following method may also yield Golay sequences of length of 7. Let a and b be Golay pairs of length S=3. Then, $$x_e(z) = w_1 x_a(z^\ell) + w_2 x_b(z^\ell) z^{S+1} \text{ and} \quad \text{Equation 32}$$

$$x_f(z) = w_1 x_a(z^\ell) - w_2 x_b(z^\ell) z^{S+1} \quad \text{Equation 33}$$

may also be Golay pairs and may also be expressed equivalently as:

$$e = [w_1 a \ 0 \ w_2 b] \text{ and} \quad \text{Equation 34}$$

$$f = [w_1 a \ 0 \ -w_2 b]. \quad \text{Equation 35}$$

For example, a QPSK-based Golay pair a and b for the length of S=3 may be a=[1 1i 1] and b=[1 1 −1]. Other equivalent sequences (there may be 128 of them) may also be generated by applying operations like conjugations and flipping. Based on equations (2a) and (2b), e=[1 1i 1 0 1 1 −1] and f=[1 1i 1 0 −1 −1 1].

In order to utilize e and f for single-band and multi-band operations, the following rules and cases may be considered.

In case 1, the number of active channels may be 1. When only one of the channels may be active, either e or f may be mapped to the corresponding channel. Since e and f are the Golay sequences, they may lead to signals where their PAPR are less than 3 dB.

In case 2, the number of active channels may be 2. The sequences e and f may be the Golay pairs. Based on Property 1 given above, e and f may be used in the expression in Property 1 again and a large Golay sequence may be generated. For example, the sequence [e 0 f] may be also another Golay sequence since m in Property 1 may be chosen freely. This also means that the sequences e and f may be mapped to different channels, regardless of the separation between the channels, without affecting the PAPR.

For example, the vector e and the vector f may be mapped to the $1^{st}$ and the $3^{rd}$ channels, respectively, shown in FIG. 4B. In another example, the vector f and the vector e may be mapped to the $1^{st}$ and the $4^{th}$ channels, respectively, shown in FIG. 4B. It may be worth noting that, e and f may also be manipulated based on Property 1 before mapping to the subcarriers. For example, one channel may utilize the sequence e while the other channel may utilize the sequence −f.

In case 3, the number of active channels may be 3. Based on Property 1, a Golay sequence which covers 3 channels may be generated as follows:

$$x_t(z) = w_1 x_a(z) x_{[a \ 0_{1 \times 29}]}(z) + w_2 x_b(z^{32}) x_{[b \ 0_{1 \times 29}]}(z^\ell) z^4 \quad \text{Equation 36}$$

This expression means that:

$$t = a \otimes [a \ 0_{1 \times 29}] + \text{circshift}(b \otimes [b \ 0_{1 \times 29}], 4), \quad \text{Equation 37}$$

where ⊗ may be Kronecker product and circshift(•, k) may be a circular shift operation to the right by k elements.

For example, if a=[1 1i 1] and b=[1 1 −1], the vector t may be obtained as $$t = [a \ 0 \ b \ 0_{1 \times 25} \ ia \ 0 \ b \ 0_{1 \times 25} \ a \ 0 \ -b]. \quad \text{Equation 38}$$

In other words, if the channels are contiguous, the $1^{st}$, the $2^{nd}$, and the $3^{rd}$ channels may use e=[a 0 b], h=[ia 0 b], and f=[a 0 −b], respectively.

Unfortunately, Property 1 may not yield Golay sequences with QPSK alphabet when the channels are not contiguous.

Nevertheless, one may still use e or f to decrease the transmitter complexity for the discontinuous case. For example, 1×e, 1×f, and 1i×f may be used for $1^{st}$, $2^{nd}$, and $4^{th}$ channels, respectively. The order of the sequences may change and the corresponding coefficients may be the elements of QPSK constellation. In another example, e and f may be used and another sequence for the third channel may be obtained by a computer search. For example, e and f may be used for the $1^{st}$ and the $4^{th}$ channel and the third channel may be comp=[1 1 1 0 −1 −1i 1i], which may minimize the PAPR for the resulting signal.

In case 4, the number of active channels may be 4. This case may be addressed by utilizing Property 1 two times over e and f. For example, the first operation may generate:

$$t_1=[e\ 0_{1\times 25}\ f]\ \text{and}\ t_2=[e\ 0_{1\times 25}\ -f], \quad \text{Equation 39}$$

where $t_1$ and $t_2$ are Golay pairs. By utilizing Property 1 a second time, it may be seen that:

$$t_3=[t_1\ 0_{1\times 25}\ t_2]\ \text{and}\ t_4=[t_1\ 0_{1\times 25}\ -t_2], \quad \text{Equation 40}$$

where $t_3$ and $t_4$ are also Golay pairs. Explicitly, $t_3$ and $t_4$ may be expressed as:

$$t_3=[e\ 0_{1\times 25}\ f\ 0_{1\times 25}\ e\ 0_{1\times 25}\ -f], \text{and} \quad \text{Equation 41}$$

$$t_4=[e\ 0_{1\times 25}\ f\ 0_{1\times 25}\ -e\ 0_{1\times 25}\ f]. \quad \text{Equation 42}$$

Thus, for example, if the $1^{st}$, $2^{nd}$, $3^{rd}$, and $4^{th}$ channels utilize e, f, e, and −f (i.e., $t_3$), respectively, the PAPR may be less than 3 dB even though four channels are active at the same time. In another example, if the $1^{st}$, $2^{nd}$, $3^{rd}$, and $4^{th}$ channels utilize e, f, −e, and f (i.e., $t_4$), respectively, the PAPR of the corresponding signal in time may be less than 3 dB.

Based on the rules and cases above, a table may be generated that shows how e, f, h, and comp sequences are utilized in the channel for a given bit. For example, assuming $$e=[a\ 0\ b]=[1\ 1i\ 1\ 0\ 1\ 1\ -1], \quad \text{Equation 43}$$

$$f=[a\ 0\ -b]=[1\ 1i\ 1\ 0\ -1\ -1\ 1], \quad \text{Equation 44}$$

$$h=[ia\ 0\ b]=[1i\ -1\ 1i\ 0\ 1\ 1\ -1], \text{and} \quad \text{Equation 45}$$

$$\text{comp}=[1\ 1\ 1\ 0\ -1\ -1i\ 1i], \quad \text{Equation 46}$$

the corresponding Table 1 for all cases may be given.

TABLE 1

Golay-based construction for up-to 4 channels

| # of active channels | Coded bits across the channels (e.g., for each 2 μs) | Sequence for channel 1, $s_{ch_1}$ | Sequence for channel 2, $s_{ch_2}$ | Sequence for channel 3, $s_{ch_3}$ | Sequence for channel 4, $s_{ch_4}$ |
|---|---|---|---|---|---|
| 0 | 0000 | 0 | 0 | 0 | 0 |
| 1 | 1000 | e | 0 | 0 | 0 |
|   | 0100 | 0 | e | 0 | 0 |
|   | 0010 | 0 | 0 | e | 0 |
|   | 0001 | 0 | 0 | 0 | e |
| 2 | 1100 | e | f | 0 | 0 |
|   | 0110 | 0 | e | f | 0 |
|   | 0011 | 0 | 0 | e | f |
|   | 1001 | e | 0 | 0 | f |
|   | 1010 | e | 0 | f | 0 |
|   | 0101 | 0 | e | 0 | f |
| 3 | 0111 | 0 | e | h | f |
|   | 1110 | e | h | f | 0 |

TABLE 1-continued

Golay-based construction for up-to 4 channels

| # of active channels | Coded bits across the channels (e.g., for each 2 μs) | Sequence for channel 1, $s_{ch_1}$ | Sequence for channel 2, $s_{ch_2}$ | Sequence for channel 3, $s_{ch_3}$ | Sequence for channel 4, $s_{ch_4}$ |
|---|---|---|---|---|---|
|   | 1011 | f | 0 | comp | e |
|   | 1101 | e | comp | 0 | f |
| 4 | 1111 | e | f | e | −f |

For up to 2 channels (e.g., as shown in FIG. 4A), the mapping table may be given in Table 2.

TABLE 2

Golay-based construction for up-to 2 channels

| # of active channels | Coded bits across the channels (e.g., for each 2 μs) | Sequence for channel 1, $s_{ch_1}$ | Sequence for channel 2, $s_{ch_2}$ |
|---|---|---|---|
| 0 | 00 | 0 | 0 |
| 1 | 01 | e or f | 0 |
|   | 10 | 0 | f or e |
| 2 | 11 | e | f |

It will be appreciated that Table 1 and Table 2 are merely examples. The location of e, f, h, and comp, and their contents for different channels may be different. If e, f, h are the Golay sequences, the PAPR may be reduced to less than 3 dB except in the cases where bits are 1011 or 1101.

Figure 9:
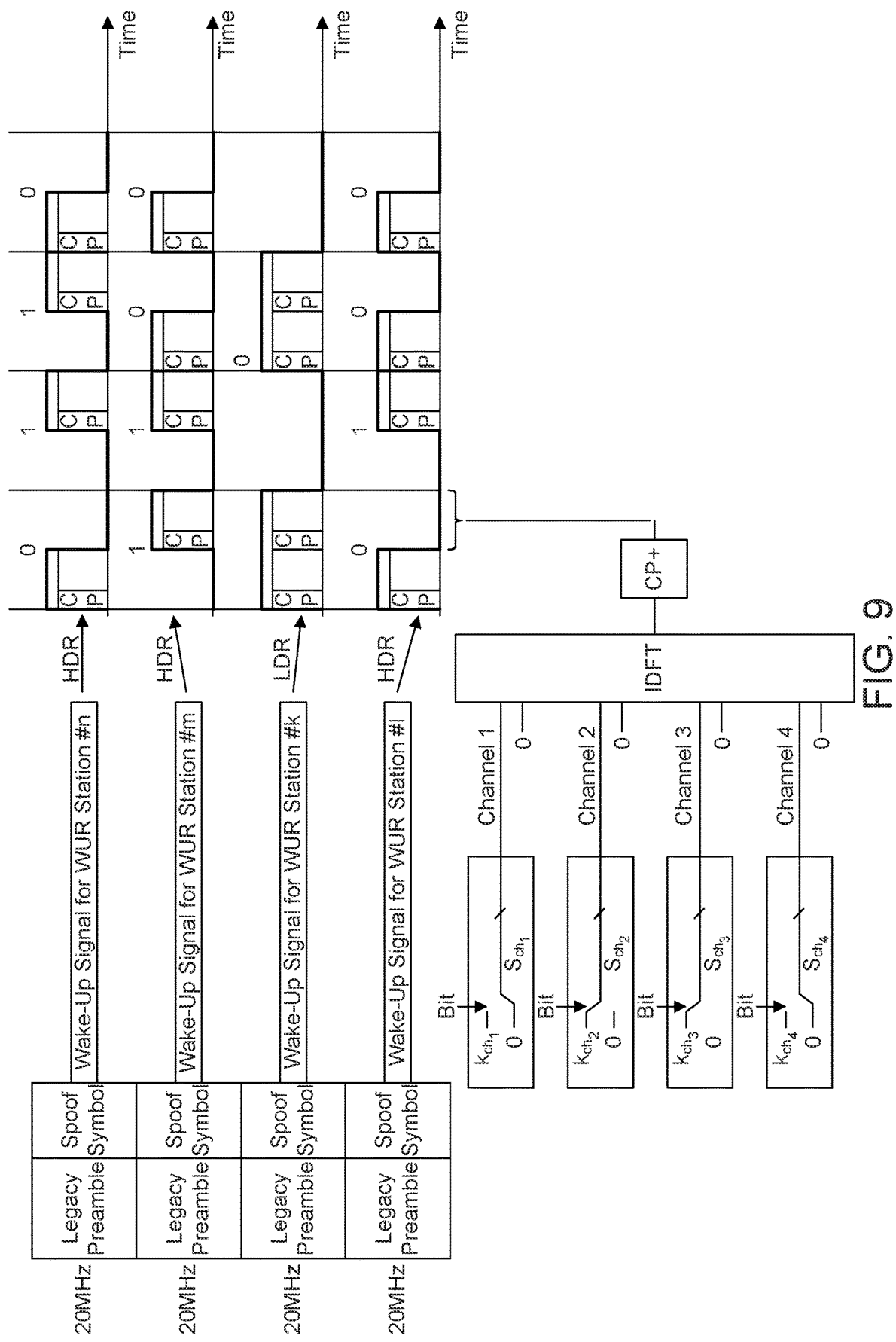
FIG. 9 shows a transmitter block diagram for constructing a Golay-based multi-band OOK waveform.

FIG. 9 shows a corresponding transmitter block diagram, which may use Table 1. In FIG. 9, $k_{ch_1}$, $k_{ch_2}$, $k_{ch_3}$ and $k_{ch_4}$ may be the non-zero sequences (e.g., e, f, h, and comp) given in Table 1 for the $1^{st}$, $2^{nd}$, $3^{rd}$, and $4^{th}$ channel, respectively, based on a coded bit transmitted on some duration (e.g., 2 μs).

Figure 10A:
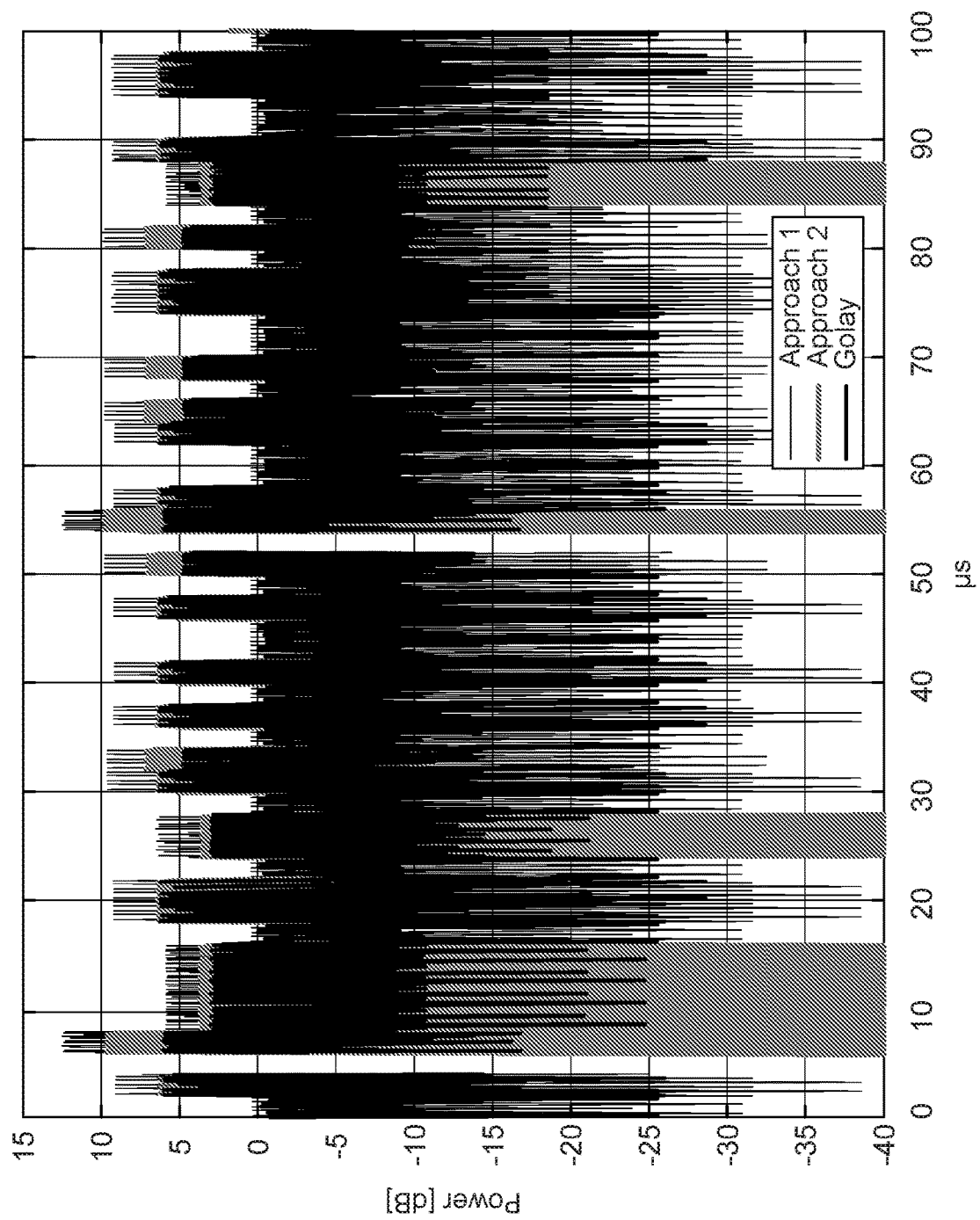
FIG. 10A shows a generated signal when four channels, each with an HDR wake-up signal, are utilized.
Figure 10B:
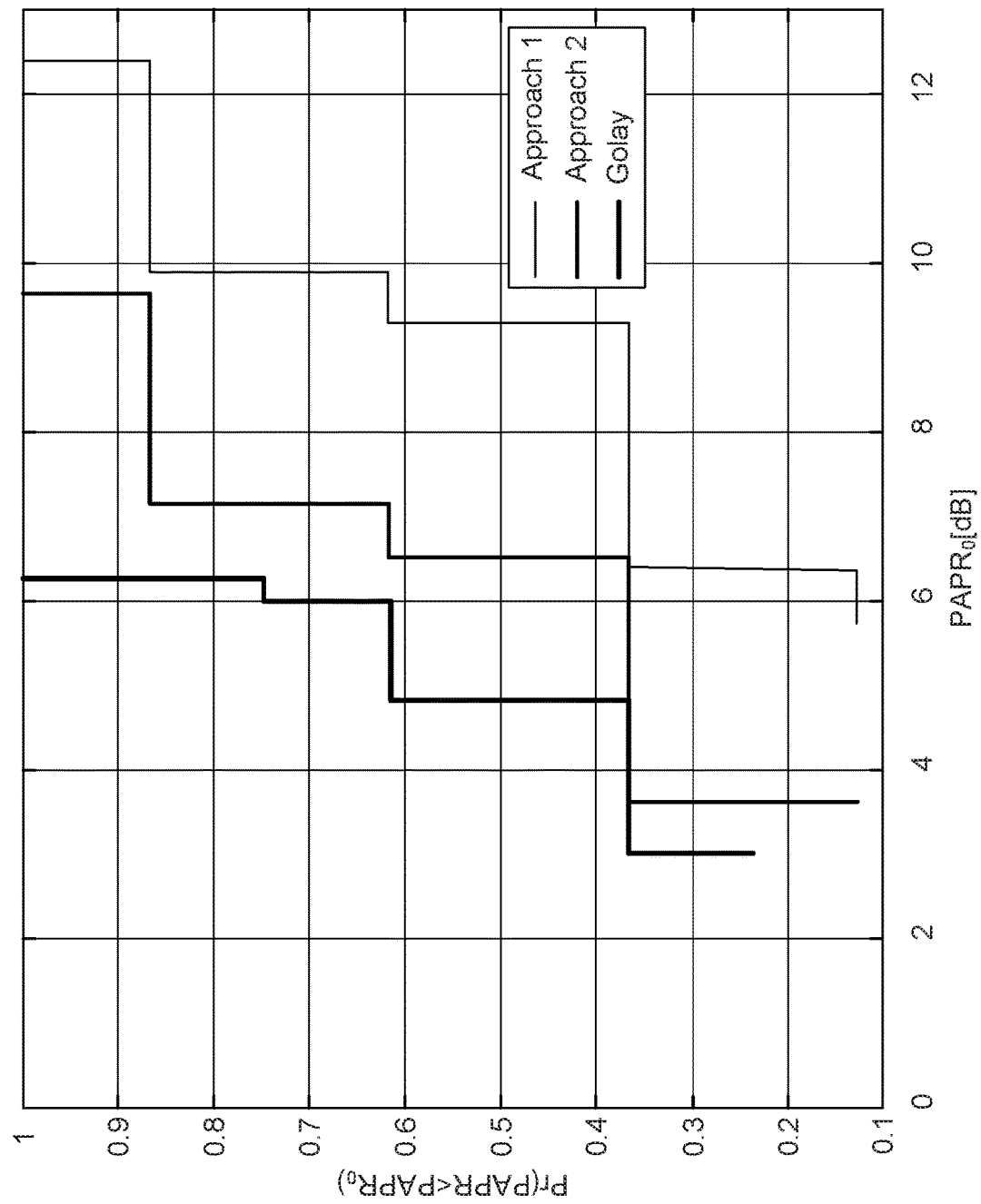
FIG. 10B shows a PAPR distribution when four channels, each with an HDR wake-up signal, are utilized.

FIG. 10A shows a generated signal when four channels are utilized. Each 20 MHz channel may have one HDR WUS. FIG. 10A. FIG. 10B shows PAPR distribution when four channels are utilized. Each 20 MHz channel may have one HDR WUS. FIGS. 10A-10B show the performance improvement (Golay) over Approach 1 and Approach 2. FIGS. 10A-10B are directed to reducing PAPR with Golay-based multi-band OOK and show performance improvements when compared to FIGS. 6A and 6B. Specifically, FIG. 10A shows a generated signal when four channels are utilized (each 20 MHz channel has one HDR WUS). FIG. 10B shows a PAPR distribution when four channels are utilized (each 20 MHz channel has one HDR WUS). The Golay based construction may lead to 6 dB and 3 dB improvements as compared to conventional approaches, Approach 1 and Approach 2, respectively.

Figure 11:
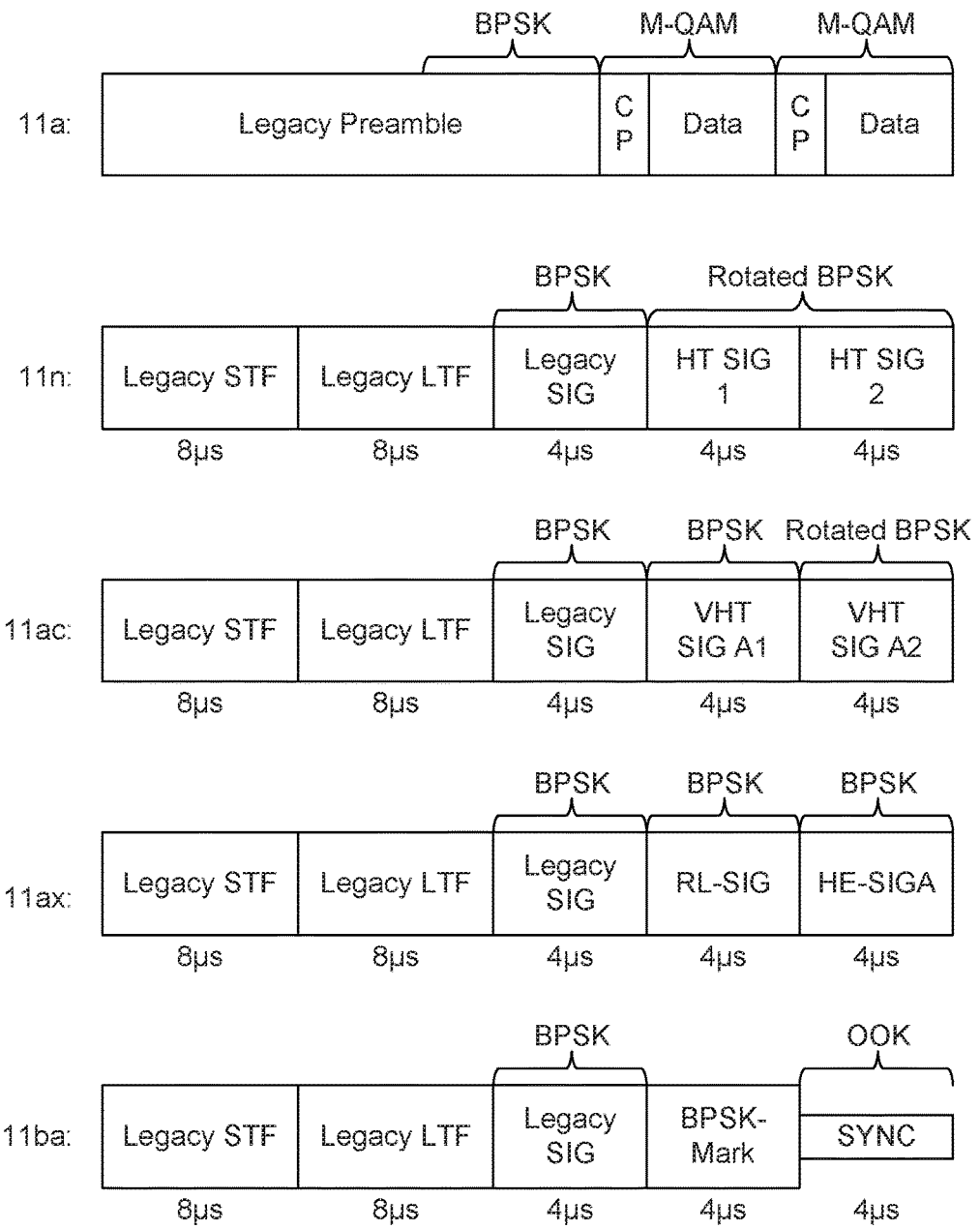
FIG. 11 shows preamble formats for various IEEE 802.11 standards.

FIG. 11 shows preamble formats for various IEEE 802.11 standards. The various preamble fields, as shown, include legacy short training field (L-STF), legacy long training field (L-LTF), legacy signal (L-SIG) field, repetition legacy signal (RL-SIG) field, high throughput (HT) SIG fields 1 and 2, very high throughput (VHT) SIG fields A1 and A2, and high efficiency (HE) SIG field.

The preambles for each IEEE 802.11 standard are different and designed to achieve several purposes such as backward compatibility (i.e., the receiver can recognize the different 802.11 formats) or early termination of the packet in case of unrecognized Physical Layer Convergence Procedure (PLCP) Protocol Data Unit (PPDU) which may lead to AP-power saving.

For an IEEE 802.11a receiver, the PPDU validity may be checked at the MAC level. Hence, there may be no mechanism to check the validity of non-IEEE 802.11a PPDUs (such as those in IEEE 802.11n, IEEE 802.11ac, IEEE 802.11ax, or IEEE 802.11ba). In addition, the IEEE 802.11a receiver procedure may not offer a method for early termination to save AP power in physical layer.

An IEEE 802.11n receiver may be compatible with both IEEE 802.11a and IEEE 802.11n PPDUs. The IEEE 802.11n receiver may identify IEEE 802.11n and IEEE 802.11a PPDUs by detecting π/2 rotation of the binary phase-shift keying (BPSK) constellation at HT-SIG-1 field. BPSK, which may also be called phase reversal keying (PRK) may be the simplest form of PSK. It may use two phases that are separated by 180° and so can also be termed 2-PSK.

If the rotation is detected, the receiver may consider the PPDU as an IEEE 802.11n PPDU. If the cyclic redundancy check (CRC) fails at HT-SIG-2 after the rotation, the receiver may check if there is any energy drop at the signal level. If there is an energy drop, the receiver may set the CCA state as IDLE. The IEEE 802.11n receiver may recognize an IEEE 802.11ax PPDU and an IEEE 802.11ac PPDU as an IEEE 802.11a PPDU, and the validity of these PPDU may fail at MAC layer. Hence, there may be no explicit power saving (i.e., early termination) at the PHY layer.

An IEEE 802.11ac receiver may follow a similar rationale to IEEE 802.11n. The IEEE 802.11ac receiver may first detect if the is any π/2 rotation between 20-24 μs. If there is a rotation, the IEEE 802.11ac receiver may recognize the received signal is neither an IEEE 802.11a nor an IEEE 802.11ac PPDU and may apply the procedures described for IEEE 802.11n. If there is no rotation, the IEEE 802.11ac receiver may check the cyclic redundancy code at VHT-SIG2. If the cyclic redundancy code is not valid, it may apply the received procedure for IEEE 802.11a. If the cyclic redundancy code is valid, the packet may be recognized as an IEEE 802.11ac PPDU. The length subfield of L-SIG may be set to integer multiple of 3 for an IEEE 802.11ac PPDU.

An IEEE 802.11ax receiver may apply hierarchical detection. The IEEE 802.11ax receiver may first check if there may be any repetition between 16-20 μs and 20-24 μs (the IEEE 802.11ax PPDU may have a field called RL-SIG after L-SIG and it may be the repetition of L-SIG field). If there is no repetition, the receiver may recognize that the received signal is not an IEEE 802.11ax PPDU and may apply the preamble detection for IEEE 802.11ac, IEEE 802.11n, and IEEE 802.11a by exploiting the rotations and the CRC of IEEE 802.11ac and IEEE 802.11n SIG fields. If there is repetition, the IEEE 802.11ac receiver may check the validity of HE-SIG-A. If the cyclic redundancy code is not valid, the IEEE 802.11ax receiver may wait for the duration that may be indicated at L-SIG. The length subfield of L-SIG may be set to a non-integer multiple of 3 for an IEEE 802.11ax PPDU.

In IEEE 802.11ba, there may be a potential energy drop for an IEEE 802.11ba PPDU (e.g., due to the narrow-band signal and regulations). A BPSK-mark signal may be added after an L-SIG field in an IEEE 802.11ba PPDU. The BPSK-mark field may avoid existing IEEE 802.11 receivers in the same environment to fall back to IEEE 802.11n mode, which may check the signal power level if the CRC fails. Hence, the BPSK-mark sequence may be a random BPSK sequence for a spoofing purpose. On the other hand, the structure of the BPSK-mark may be important for devices using future standards to indicate signature information related to WUS (or any other signature information related to any type of AP) and random BPSK may not be the best solution. Considering there are different types of signature information for future devices, methods for enhanced mark-indication may also be desired.

The IEEE 802.11ba protocol is intended to reduce the power consumption at the receivers. However, an IEEE 802.11ba PPDU may be recognized as an IEEE 802.11a PPDU at IEEE 802.11 receivers. Hence, an IEEE 802.11ba PPDU may cause power consumption at the other radios in the same environment. Thus, methods which allow for early termination may also be desired.

Figure 12:
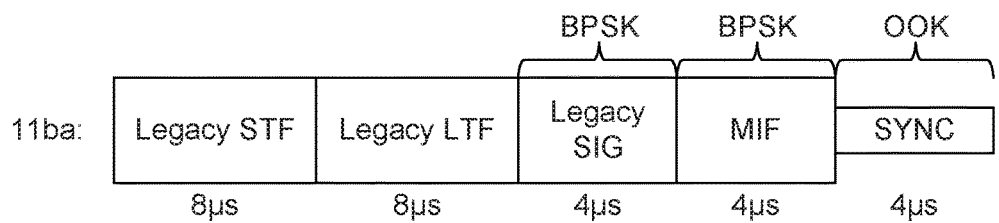
FIG. 12 shows a preamble format with a mark-indication field according to one or more embodiments.

A mark-indication field (MIF) and a repeated L-SIG for PPDU identification may be used. FIG. 12 shows an MIF appended after an L-SIG field. The modulation for the MIF may be based on BPSK or QPSK. The MIF may carry an encoded information or a signature sequence.

When the MIF carries a signature sequence, the signature sequence may be generated through a sequence modulation. The signature sequence for MIF may be based on a Golay sequence. For example, for 20 MHz, the number of tones around direct current (DC) tone may be 26 on the left and 26 on right. The signature sequence may be a modulated sequence as:

$$R_{-26,26} = [m_1 \times S_{-26,-1}; 0; m_2 \times S_{1,26}], \quad \text{Equation 47}$$

where $m_1$ and $m_2$ may be modulation symbols, and $S_{-26,-1}$ and $S_{1,26}$ may be a complementary pair. For example, $S_{-26,-1}$ and $S_{1,26}$ may be the following BPSK sequences:

$$S_{-26,-1} = [1;1;1;1;-1;1;1;-1;-1;1;-1;1;-1;-1;1;-\\1;1;1;1;-1;-1;1;1;1] \quad \text{Equation 48}$$

$$S_{1,26} = [1;1;1;1;-1;1;1;-1;-1;1;-1;1;1;1;1;-1;1;-1;-\\1;-1;1;1;-1;-1;-1] \quad \text{Equation 49}$$

In another example, the signature sequence may be a modulated sequence such as one of the following:

$$R_{-26,26} = [m_1 \times S_{-26,-24}; m_2 \times S_{-13,-1}; 0; m_3 \times S_{1,13}; -m_4 \times S_{14,26}], \text{ or} \quad \text{Equation 50}$$

$$R_{-26,26} = [m_1 \times S_{-26,-24}; m_2 \times S_{-13,-1}; 0; -m_3 \times S_{1,13}; m_4 \times S_{14,26}], \quad \text{Equation 51}$$

where $m_1$, $m_2$, $m_3$, and $m_4$ may be modulation symbols, and $S_{-26,-1}$ and $S_{1,26}$ may be the following QPSK sequences;

$$S_{-26,-24} = \quad \text{Equation 52}$$

$$S_{1,13} = \frac{\sqrt{2}}{2}[1;\ 1;\ 1;\ 1i;\ -1;\ 1;\ 1;\ -1i;\ 1;\ -1;\ 1;\ -1i;\ i],$$

$$S_{-13,-1} = S_{14,26} = \quad \text{Equation 53}$$

$$\frac{\sqrt{2}}{2}[1;\ 1i;\ -1;\ -1;\ -1;\ 1i;\ -1;\ 1;\ 1;\ -1i;\ -1;\ 1;\ -1i].$$

The modulation symbols may indicate the signature information related to the AP or ID. It may indicate the purpose of the transmission such as wake-up purpose. The main benefit of theses sequences may be that the PAPR may be less than 3 dB for any QPSK modulation symbol. Orderly flipped and conjugated versions of these sequences may be used.

When the MIF carries encoded information, the MIF may include several field that indicate the signature of the AP. For example, the subfields for MIF may be a signature field, CRC, and tail bits for encoding operation as illustrated in FIG. 13.

The BPSK-Mark may be encoded with the rate of 1/2 and interleaved before constellation mapping similar to L-SIG.

The number of bits in signature, CRC and tail bit subfields may be different from those in FIG. 13. In addition, the relative locations of those bit subfields may also be different from the one shown in FIG. 13.

The MIF may be provided with enough separation from IEEE 802.11a signals. Because the MIF symbol may be modulated using BPSK, a valid sequence pattern or correct CRC check of a MIF CRC may trigger a IEEE 802.11ba device which monitors on the Primary Connectivity Radio (PCR) to declare the PPDU as a IEEE 802.11ba frame. However, there may be no guarantee that a valid IEEE 802.11a frame would not trigger such behavior. If the frame may be an IEEE 802.11a frame and triggers the above behavior, the receiving IEEE 802.11ba STA would have missed the IEEE 802.11a PPDU, either intended for the STA or not intended for the STA but the STA would miss setting NAV correctly.

The IEEE 802.11a specification mandates the last 9 bits of a SERVICE field to be set to 0. Over the air, these bits would be scrambled by a scrambling sequence initiated by the bit 0-6 of the SERVICE field.

To avoid STA missed-categorizing an IEEE 802.11a PPDU as an IEEE 802.11ba PPDU, one or more of the bits corresponding to the position within the last 9 bits of SERVICE field, could be reserved. These reserved bits may be set to different values than the values that would normally be set in an IEEE 802.11a frame using 0 at the position after scrambling. For example, if the bit of the MIF 0~6 may be set to 1111111, then for a valid IEEE 802.11a frame, the subsequent 9 bits may be 000011101. If the MIF field has any of these bits set to a different value, the IEEE 802.11ba receiver may conclude it may be not a valid IEEE 802.11a frame and interpret these bits as corresponding to a IEEE 802.11ba MIF field.

This approach may be combined with the setting of L_LENGTH mod 3=1 or 2, such that the IEEE 802.11ba receiver would not confuse MIF as the first OFDM symbol of IEEE 802.11ac SIG.

This approach may eliminate the usage of RL-SIG (Repeated L-SIG, used in IEEE 802.11ax), such that in one OFDM symbol, the IEEE 802.11ba receiver may determine it is not an IEEE 802.11ax or IEEE 802.11a frame while providing signaling in the same symbol.

In an example, L-SIG, which may have a LENGTH subfield set to a non-integer multiple of 3 value (e.g., 3m+1 or 3m+2, where m may be an integer), may be repeated after L-SIG as RL-SIG. The MIF, which consists of encoded or sequence-based signature information, may be appended after an RL-SIG. FIG. 14A shows L-SIG repeated after L-SIG as RL-SIG using BPSK. FIG. 14B shows L-SIG repeated after L-SIG as RL-SIG using rotated BPSK.

If the LENGTH subfield of L-SIG is a non-integer multiple of 3 PPDU, an IEEE 802.11ax receiver may recognize the IEEE 802.11ba PPDU as an IEEE 802.11ax packet. Since the CRC may not be valid for a IEEE 802.11ba PPDU, the IEEE 802.11ax receiver may classify the received signal as an unsupported PPDU and stop decoding (i.e., power saving). In addition, devices with future generation of the standards may recognize the MIF field after the repetition (i.e., after the RL-SIG) and decode MIF field to learn the signature or other information related to PPDU such as purpose.

The encoded signature information may consist of CRC and tails bits as illustrated in FIG. 13. The sequence-based signature information may carry modulation symbols such as those described above (e.g., $m_1$, $m_2$, $m_3$, and/or $m_4$).

To avoid two-level hypothesis test that rely on CRC at future receivers, the BPSK constellation for MIF may be rotated by 90 degrees as shown in FIG. 14B to differentiate itself from an IEEE 802.11ax PPDU. After the repetition check, the receiver may check if the constellation may be rotated or not between 24-28 μs. If it is rotated, the receiver may recognize the field as an MIF field. If it is not rotated, the receiver may recognize the field as an HE-SIG-A (i.e., corresponding to IEEE 802.11ax).

Figure 15:
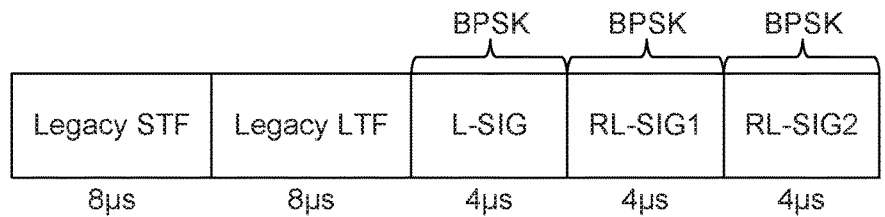
FIG. 15 shows a preamble with multiple repeated legacy signal fields.

Multiple repeated L-SIG (RL-SIG) fields may also be used. According to an embodiment, L-SIG may be repeated multiple times (i.e., two or more times) in the form of multiple RL-SIG fields. The subfield LENGTH may be set to a non-integer multiple of 3 to spoof IEEE 802.11ax receivers as shown in FIG. 15. The receivers may check if there is another repetition between 16-20 μs and 20-24 μs besides the repetition between 20-24 μs and 24-28 μs.

Figure 16:
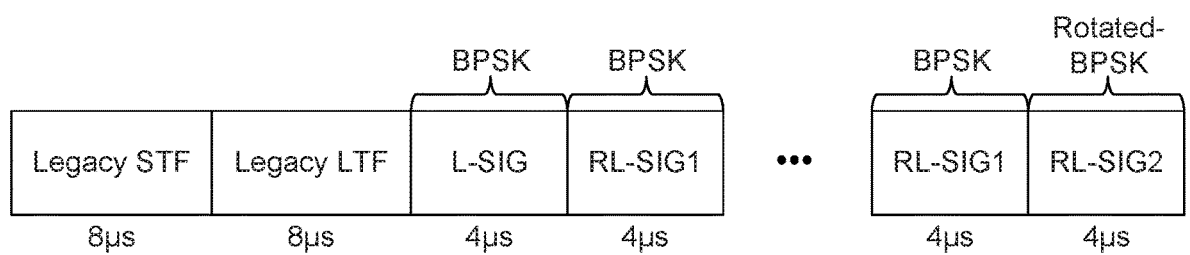
FIG. 16 shows a preamble with termination with rotated-BPSK.
Figure 17:
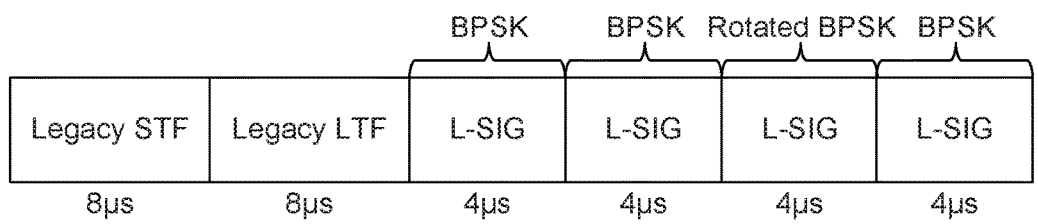
FIG. 17 shows a preamble with combined BPSK and rotated BPSK.

Signaling with rotated BPSK over multiple L-SIGs may also be used. For example, the number of repetitions may signal the signature of the PPDU (e.g., IEEE 802.11ax or IEEE 802.11ba) and the last RL-SIG field may by phase rotated by 90 degrees to differentiate different signatures as shown in FIG. 16. In another example, the combination of BPSK and rotated BPSK may signal the device signature as illustrated in FIG. 17. The placement of the rotated BPSK among RL-SIGs (e.g., first, second, last) may indicate the device signature.

Signaling with mismatched or partially repeat L-SIGs may also be used. The reserved bit in the L-SIG field in the legacy preamble may be used to indicate that the packet carrying the legacy preamble is a new generation of preambles and may be ignored by older generation devices. A possible exception may be that the older generation devices may need to respect or adhere to the length indication included in the legacy preamble.

In an example, a currently reserved bit (e.g., bit 4) may be set to 1 to indicate that the packet carrying the legacy preamble includes a new generation of preambles, such as WUR frames, EHT frames, or future generation frames. A legacy device, for example, IEEE 802.11a, IEEE 802.11b, IEEE 802.11ac, IEEE 802.11ax, other IEEE 802.11 devices, or new radio (NR)-U devices, after receiving an L-SIG, may be configured to detect that the reserved bit is set to 1 and that the parity is correct for the L-SIG. The legacy device may ignore the packet but may respect the length indication included in the L-SIG.

In an example, a partially repeated L-SIG (PR-SIG) symbol may be added after the regular L-SIG to indicate that the current preamble may be part of a packet that carries a future generation frame. The indication may include an indication that the packet carrying the legacy preamble includes a new generation of preambles, such as WUR frames, EHT frames, or future defined frames. For example, a repeated L-SIG symbol may be provided after a regular L-SIG symbol. However, one or more sub-fields in the PR-SIG may be deliberately set to a different value than one or more sub-fields in the L-SIG to provide further indication. A legacy device, after receiving an L-SIG, may be configured to detect these indications and that the parity is correct for the L-SIG and/or PR-SIG. The legacy device may ignore the packet but may respect the length indication included in the L-SIG.

In an example, the reserved bit (e.g., bit 4) in the PR-SIG may be set to 1, which may be similar to the setting in the L-SIG. In another example, the reserved bit (e.g., bit 4) may be set to 1, which may be different than bit 4 in L-SIG, which may be set to be 0.

In another example, the parity setting may be different in the PR-SIG than that in the L-SIG. The L-SIG may be set to even parity while the PR-SIG may be set to odd parity.

In yet another example, the rate subfield in the PR-SIG may be set differently than in the rate subfield in the L-SIG. For example, bit 3 (i.e., R4) of the rate subfield in the PR-SIG may be set to 0. The other three bits in the rate subfield in the PR-SIG may set to be identical to the first three bits in the rate subfield in the L-SIG field. In another implementation, the value of the rate subfield in the PR-SIG may be set at a certain offset from that in the L-SIG field. The offset value in the rate subfield of the PR-SIG may imply information, such as basic service set (BSS) color, transmission opportunity (TXOP) power, and STA IDs such as association identifiers (AIDs). In another implementation, the bits in the rate subfield in the PR-SIG may be set to the complimentary value of those bits in the rate field in the L-SIG for indicating such information.

In yet another example, the length subfield in the PR-SIG may be set differently than the length subfield in the L-SIG. For example, the value of the length subfield in the PR-SIG may be set at a certain offset from that in the L-SIG field. The offset value in the length subfield of the PR-SIG may imply information, such as BSS Color, TXOP power, and STA IDs such as AIDs. For example, if the length subfield is set to a value N in the PR-SIG and the length subfield is set to value M in the L-SIG, the value N-M representing the offset may be considered as BSS color or STA IDs such as AIDs. In another implementation, the bits in the length subfield in the PR-SIG may be set to the complimentary value of those bits in the length subfield in the L-SIG for indicating such information.

In yet another example, the tail bits in PR-SIG may be set to all 1's instead of all 0's. Parts of the features and/or indications described above may be combined in any way.

A legacy device, after receiving an L-SIG, may be configured to detect one or more of these indications and verify that the parity may be correct for the L-SIG and/or the PR-SIG. The legacy device may then ignore the packet, but may respect (i.e., adhere to) the length indication included in the L-SIG.

A unified preamble format may be implemented. In particular, a unified preamble design may be disclosed and an IEEE 802.11ax receiver, an IEEE 802.11ba receiver, and future receiver devices may use the format to distinguish the signal types.

Figure 18:
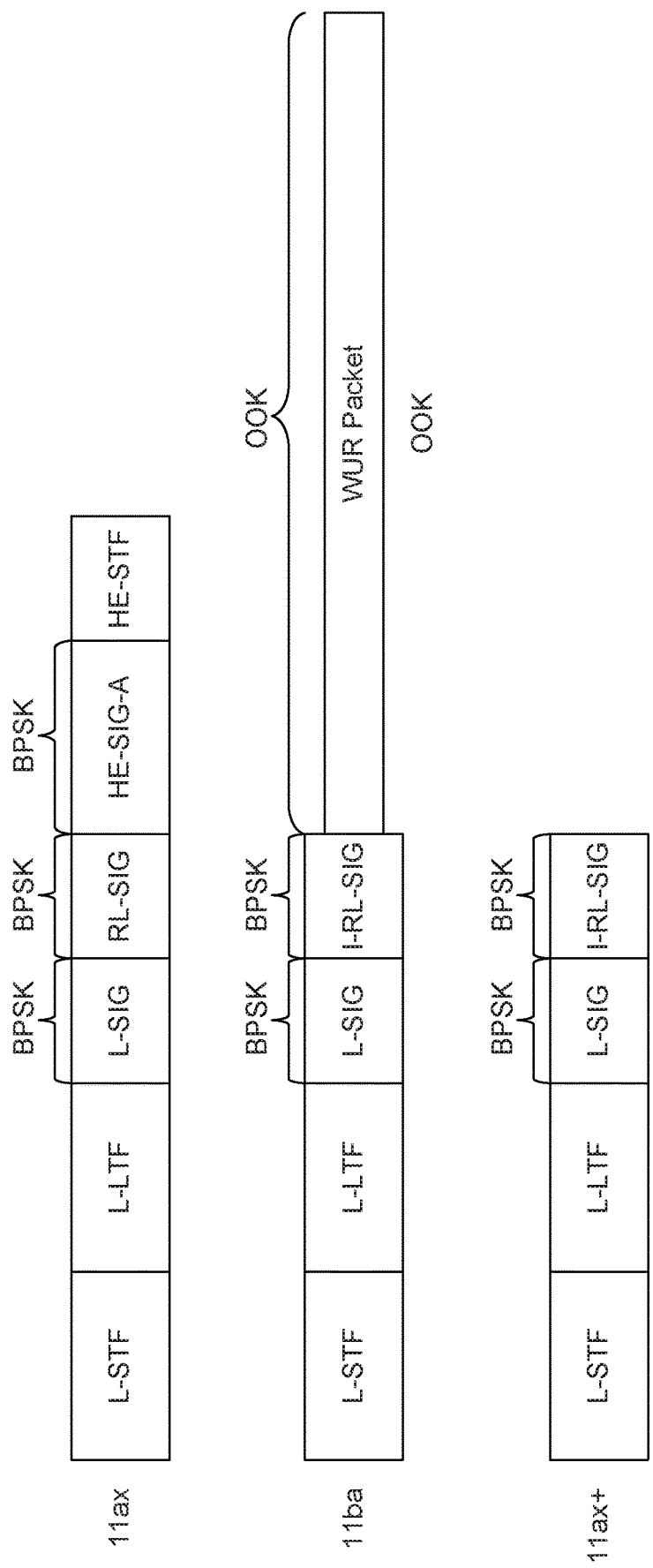
FIG. 18 shows a unified preamble design.

FIG. 18 shows an RL-SIG field introduced in IEEE 802.11ax. By detecting both L-SIG and RL-SIG, an IEEE 802.11ax receiver may perform maximum-ratio combining (MRC). Then, the receiver may check the rate and the parity subfield carried by L-SIG. If the parity check fails or the rate is not at least 6 Mbps, the receiver may determine that the signal is a legacy signal (i.e., non-HT, HT, VHT signal). Otherwise, if the parity check passes or the rate is at least 6 Mbps, the receiver may check the length subfield. If mod (Length,3) is 0, the device may treat it as legacy signal. Otherwise, the receiver may determine the signal as an IEEE 802.11ax signal.

In addition, an interleaved repetition L-SIG (I-RL-SIG) for IEEE 802.11ba or newer devices, represented as IEEE 802.11ax+ in FIG. 18, may be implemented. An additional symbol level interleaver may be applied on the repetition BPSK modulated L-SIG symbols, and then the interleaved symbols may be mapped to an OFDM symbol. The RL-SIG field utilized in IEEE 802.11ax may be treated as a special case (i.e., an identity interleaver may be used). A receiver device may use the RL-SIG field to perform auto-detection such that it may distinguish different types of IEEE 802.11 signals.

Figure 19:
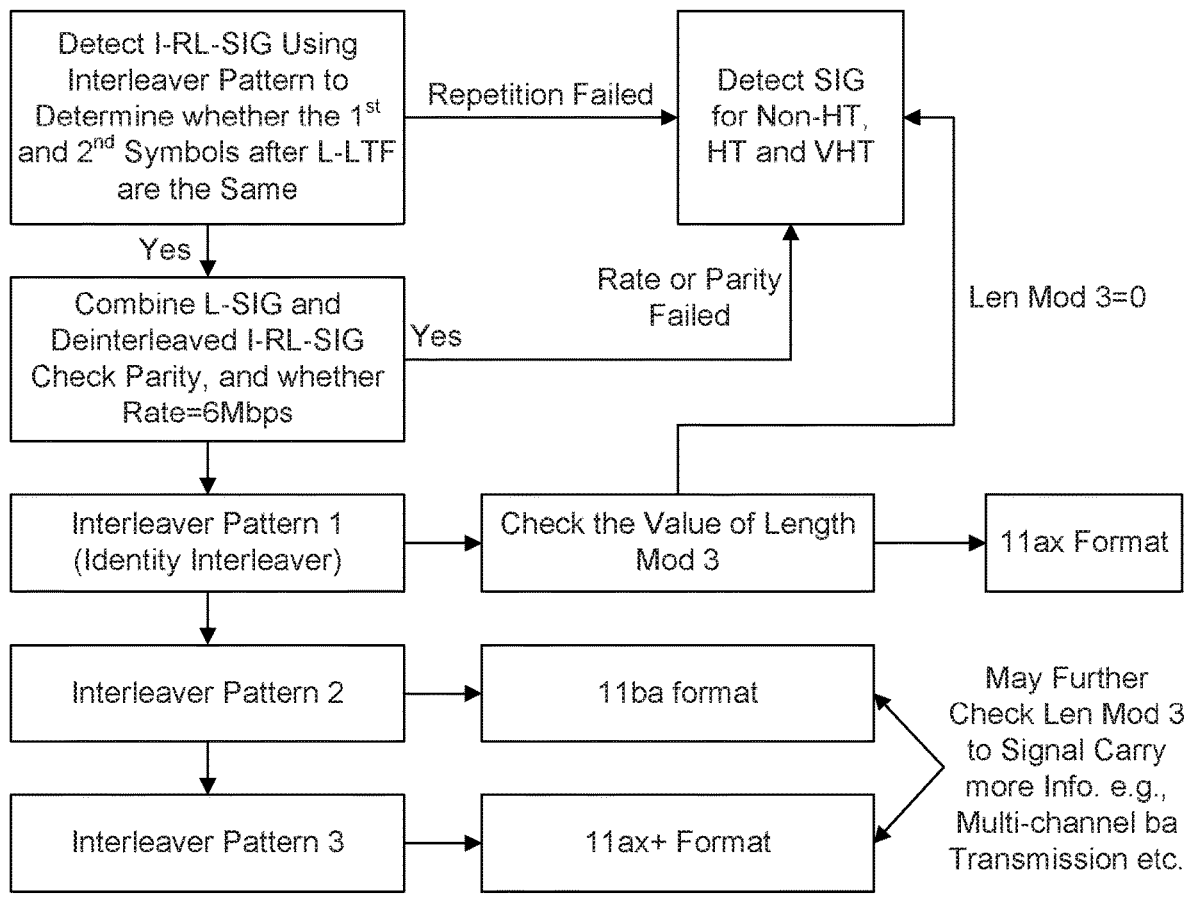
FIG. 19 shows a flow diagram of a receive procedure to distinguish different 802.11 signals according to one or more embodiments.

FIG. 19 shows a STA receive procedure used by a receiver to distinguish and identify different IEEE 802.11 signals. A STA may detect an I-RL-SIG field right after an L-SIG field. The STA may use a predefined or predetermined interleaver pattern to detect whether the first and the second symbol after the L-LTF field are the same. The STA may use all of the interleaver patterns to de-interleave the second symbol, and then check whether the first and the second symbol are the same for each interleaver pattern. The STA may record which interleaver pattern used resulted in the symbols being the same. Here, the L-SIG field may be considered as the first symbol after the L-LTF field, and the I-RL-SIG field may be considered as the second symbol after the L-LTF field.

If the first and the second symbol after the L-LTF field are not the same, the STA may determine that the repetition check failed and may check the legacy mode (e.g., non-HT, HT, and VHT modes).

If the first and the second symbol after the L-LTF field are the same, the STA may combine the L-SIG and the deinterleaved I-RL-SIG field. The STA may check the parity subfield and the rate subfield. If the parity check fails or the rate is not at least 6 Mbps, the STA may continue detect the SIG for non-HT, HT and VHT modes. Otherwise, if the parity check passes or the rate is at least 6 Mbps, the STA may check the interleaver pattern.

The STA may check the interleaver pattern, which may result in determining whether the de-interleaved second symbol is equal to the first symbol.

If interleaver pattern 1 (e.g., an identity interleaver) is used, the STA may check the value of mod(Length, 3). If the value is 0, the STA may continue to detect the SIG for non-HT, HT and VHT modes. Otherwise, the STA may continue to detect the HE SIG field and treat the signal as an IEEE 802.11ax signal.

If interleaver pattern 2 is used, the STA may consider the signal as an IEEE 802.11ba signal and may continue deferring based on the Length subfield if the STA is in the WUR mode. STAs in WUR mode may not be able to detect the L-SIG and I-RL-SIG fields. The STA may check the value of mod(Length, 3) for more information. For example, one value of mod(Length, 3) may be used to indicate the following IEEE 802.11ba signal is a beacon signal. Another value of mod(Length, 3) may be used to indicate the following IEEE 802.11ba signal is a broadcast or multicast signal and multiple WUR STAs may be woken up. Another value of mod(Length, 3) may be used to indicate the following IEEE 802.11ba signal is a unicast WUR signal which may wake up one STA.

In another example, the values of mod(Length, 3) may be used to indicate the bandwidth of the WUR signal. For example, one value of mod(Length, 3) may be used to indicate that the WUR signal will be transmitted over one channel. Another value of mod(Length, 3) may be used to indicate that the WUR signal will be transmitted over two channels. Another value of mod(Length, 3) may be used to indicate that the WUR signal will be transmitted over more than two channels.

If interleaver pattern 3 is used, the STA may determine the signal as an EHT signal or a future IEEE 802.11 signal. The STA may continue detecting the corresponding SIG fields followed. For example, the STA may check the value of mod(Length, 3) for more information, similar to the information noted above.

It will be appreciated that while three interleaver patterns are mentioned above, that the number of interleaver patterns may be not limited there to and may be greater than or less than three.

In above mentioned interleaver methods, the additional interleaver pattern applied to the second symbol after L-LTF field may be used to identify the IEEE 802.11 signal type. In another method, two more modulated BPSK symbols may be inserted on each side of the OFDM symbol. It may be noted that in current design, 48 modulated symbols are used for L-SIG and RL-SIG transmissions. With the proposed method, 52 modulated symbols may be transmitted over RL-SIG field. The L-SIG field may be 48 symbols or 52 symbols. The additional 4 symbols may be used to identify the type of IEEE 802.11 signal. In order to decode the 52 symbols more accurately, 4 additional L-LTF symbols may be inserted as a reference signal for channel estimation. The receive procedure may be modified as well. Interleaver pattern 1, 2, 3 may be replaced by the combination of the 4 additional BPSK modulated symbols.

Figure 20:
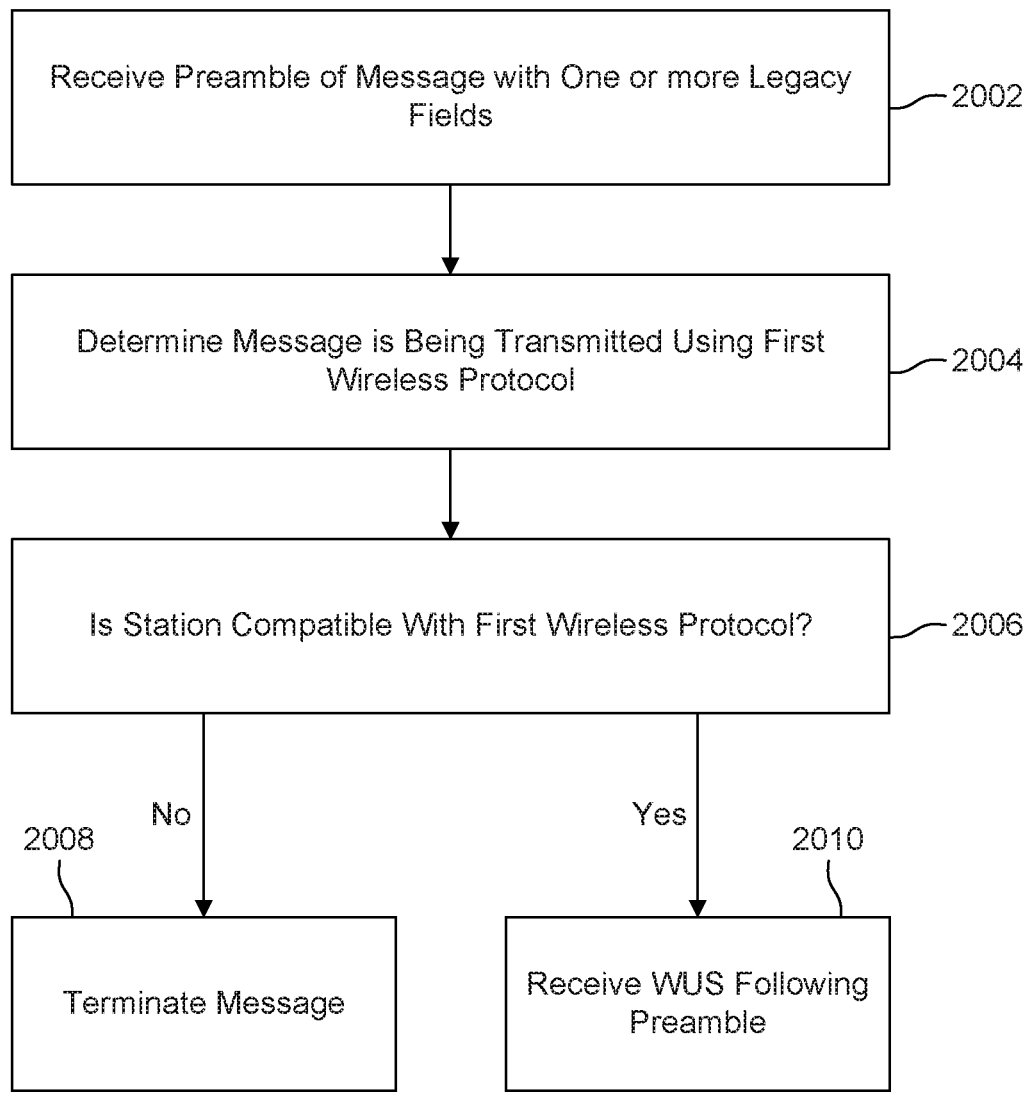
FIG. 20 shows a flow diagram of receiving a WUS.

FIG. 20 shows a flow diagram of receiving a WUS. In step 2002, a STA may receive a preamble of a message transmitted from an access point (AP). The preamble may include one or more legacy fields compatible with one or more wireless protocols. In step 2004, the STA may determine the message is being transmitted using a first wireless protocol of the one or more wireless protocols based on one or more of an explicit indication in a modulated MIF and a pattern of modulated signal fields after the one or more legacy fields. In step 2006, the STA may determine if it is compatible with the first wireless protocol. If no, in step 2008, the STA may terminate the message. If yes, in step 2010, the STA may receive a WUS following the preamble.

Figure 21:
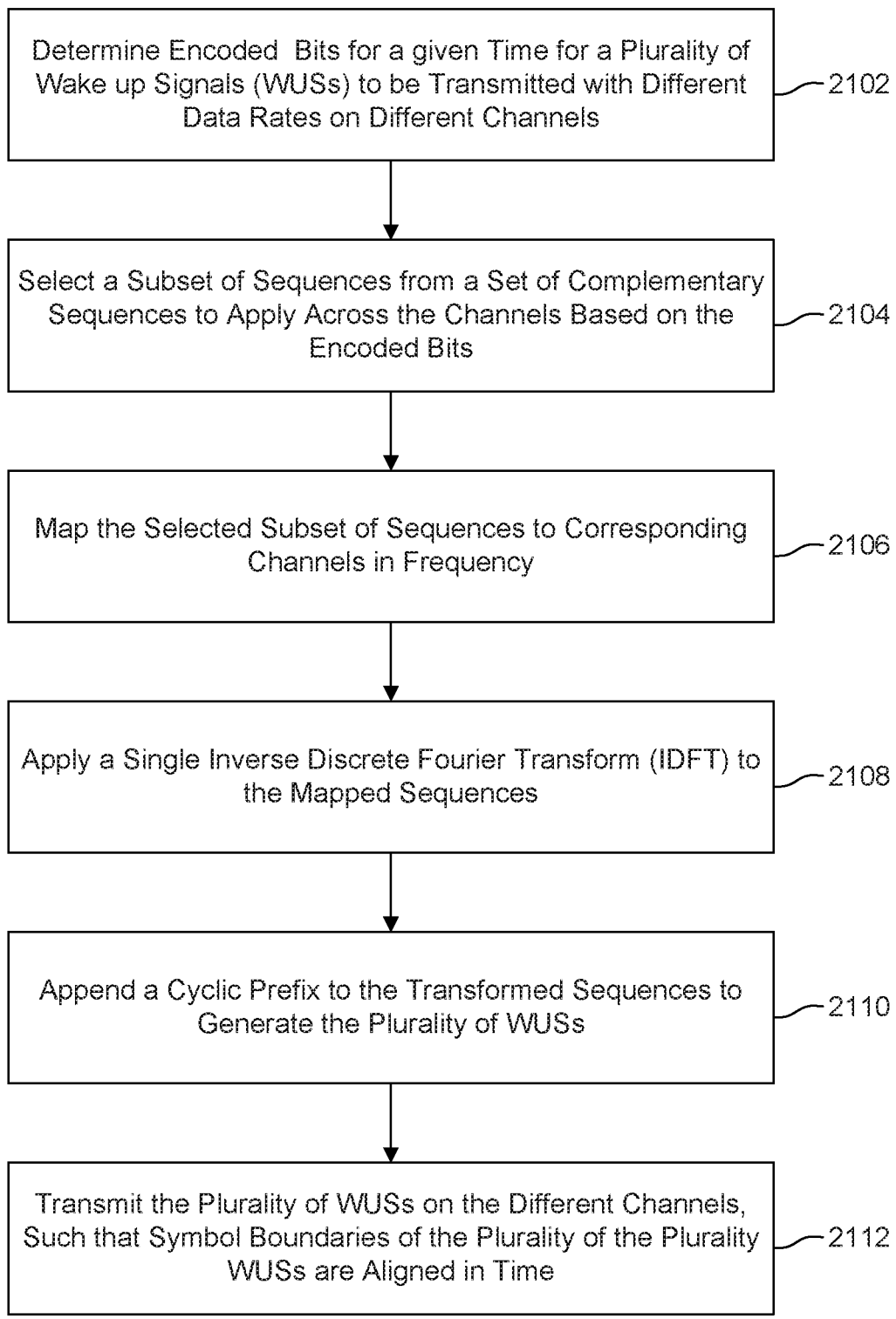
FIG. 21 shows a flow diagram of transmitting a WUS.

FIG. 21 shows a flow diagram of transmitting a WUS. In step 2102, an AP may determine encoded bits for a given time for a plurality of wake up signals (WUSs) to be transmitted with different data rates on different channels. In step 2104, the AP may select a subset of sequences from a set of complementary sequences to apply across the channels based on the encoded bits. In step 2106, the AP may map the selected subset of sequences to corresponding channels in frequency. In step 2108, the AP may apply a single inverse discrete Fourier transform (IDFT) to the mapped sequences. In step 2110, the AP may append a cyclic prefix to the transformed sequences to generate the plurality of WUSs. In step 2112, the AP may transmit the plurality of WUSs on the different channels, such that symbol boundaries of the plurality of the plurality of WUSs are aligned in time.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WTRU, UE, terminal, base station, RNC, or any host computer.

What is claimed is:

1. A method for use in an access point (AP), the method comprising:
   generating a first frame comprising a first part and a second part, wherein:
   the first part includes a physical layer (PHY) preamble comprising:
      a legacy signal (L-SIG) field using a first binary phase shift keying (BPSK) constellation; and
      a first BPSK mark field using a second BPSK constellation phase rotated relative to the first BPSK constellation; and
   the second part includes at least one wake-up radio (WUR) field, wherein the at least one WUR field includes a WUR on-off keying (OOK) synchronization (sync) field; and
   transmitting, to at least one station (STA), the first frame.

2. The method of claim 1, wherein the PHY preamble further comprises a legacy short training field (L-STF) and a legacy long training field (L-LTF).

3. The method of claim 1, wherein the second BPSK constellation of the first BPSK mark field is phase rotated by at least 90 degrees relative to the first BPSK constellation of the L-SIG field.

4. An access point (AP) comprising:
   an antenna; and
   a processor operatively coupled to the antenna; wherein the processor and the antenna are configured to:
   generate a first frame comprising a first part and a second part, wherein:
   the first part includes a physical layer (PHY) preamble comprising:
      a legacy signal (L-SIG) field using a first binary phase shift keying (BPSK) constellation; and
      a first BPSK mark field using a second BPSK constellation phase rotated relative to the first BPSK constellation; and
   the second part includes at least one wake-up radio (WUR) field, wherein the at least one WUR field includes a WUR on-off keying (OOK) synchronization (sync) field; and
   transmitting, to at least one station (STA), the first frame.

5. The method of claim 1, wherein the L-SIG field includes an indication of a length associated with the first frame.

6. The method of claim 1, wherein the at least one STA includes a WUR STA and a non-WUR STA.

7. The method of claim 1, wherein the first BPSK mark field is encoded with a rate of 1/2.

8. The method of claim 1, wherein the PHY preamble further comprises a second BPSK mark field having a BPSK constellation phase rotated relative to the first BPSK constellation of the L-SIG field.

9. The AP of claim 4, wherein the PHY preamble further comprises a legacy short training field (L-STF) and a legacy long training field (L-LTF).

10. The AP of claim 4, wherein the second BPSK constellation of the first BPSK mark field is phase rotated by at least 90 degrees relative to the first BPSK constellation of the L-SIG field.

11. The AP of claim 4, wherein the L-SIG field includes an indication of a length associated with the first frame.

12. The AP of claim 4, wherein the at least one STA includes a WUR STA and a non-WUR STA.

13. The AP of claim 4, wherein the PHY preamble further comprises a second BPSK mark field having a BPSK constellation phase rotated relative to the first BPSK constellation of the L-SIG field.

14. A method for use in a non-wake-up radio (non-WUR) station (STA), the method comprising:
- receiving, from an access point (AP), a first part of a first frame including a physical layer (PHY) preamble, wherein the PHY preamble comprises:
  - a legacy signal (L-SIG) field using a first binary phase shift keying (BPSK) constellation; and
  - a first BPSK mark field using a second BPSK constellation phase rotated relative to the first BPSK constellation, wherein a second part of the first frame is not received by the non-WUR STA in response to the BPSK constellation of the first BPSK mark field being phase rotated; and
- receiving, from the AP after a duration, a second frame.

15. The method of claim 14, wherein the second BPSK constellation of the first BPSK mark field is phase rotated by at least 90 degrees relative to the first BPSK constellation of the L-SIG field.

16. The method of claim 14, wherein the PHY preamble further comprises a legacy short training field (L-STF) and a legacy long training field (L-LTF).

17. The method of claim 14, wherein the L-SIG field includes an indication of a length associated with the first frame.

18. The method of claim 14, wherein the first BPSK mark field is encoded with a rate of 1/2.

* * * * *